United States Patent
Okina

(10) Patent No.: US 11,322,466 B2
(45) Date of Patent: May 3, 2022

(54) SEMICONDUCTOR DIE CONTAINING DUMMY METALLIC PADS AND METHODS OF FORMING THE SAME

(71) Applicant: SANDISK TECHNOLOGIES LLC, Addison, TX (US)

(72) Inventor: Teruo Okina, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 167 days.

(21) Appl. No.: 16/879,146

(22) Filed: May 20, 2020

(65) Prior Publication Data
US 2021/0366855 A1    Nov. 25, 2021

(51) Int. Cl.
*H01L 23/522* (2006.01)
*H01L 23/00* (2006.01)
(Continued)

(52) U.S. Cl.
CPC ............ *H01L 24/06* (2013.01); *H01L 23/528* (2013.01); *H01L 23/5226* (2013.01); *H01L 23/585* (2013.01); *H01L 24/03* (2013.01); *H01L 24/05* (2013.01); *H01L 24/08* (2013.01); *H01L 24/89* (2013.01); *H01L 25/18* (2013.01); *H01L 25/50* (2013.01); *H01L 2224/0557* (2013.01); *H01L 2224/05553* (2013.01);
(Continued)

(58) Field of Classification Search
CPC ... H01L 24/06; H01L 23/5226; H01L 23/528; H01L 23/585; H01L 24/03; H01L 24/05; H01L 24/08; H01L 24/89; H01L 25/18; H01L 25/50; H01L 2224/05553; H01L 2224/0557; H01L 2224/06515; H01L 2224/08147; H01L 2224/80895; H01L 2924/14511; H01L 2924/2064
See application file for complete search history.

(56) References Cited

U.S. PATENT DOCUMENTS 10,115,681 B1    10/2018  Ariyoshi
10,283,493 B1     5/2019  Nishida
(Continued)

OTHER PUBLICATIONS

U.S. Appl. No. 16/231,752, filed Dec. 24, 2018, SanDisk Technologies LLC.
(Continued)

*Primary Examiner* — Elias Ullah
(74) *Attorney, Agent, or Firm* — The Marbury Law Group PLLC

(57) ABSTRACT

A first semiconductor die includes first semiconductor devices located over a first substrate, first interconnect-level dielectric layers embedding first metal interconnect structures and located over the first semiconductor devices, a first pad-level dielectric layer embedding first bonding pads and located over the first interconnect-level dielectric layers, and first edge seal structures laterally surrounding the first semiconductor devices. Each of the first edge seal structures vertically extends from the first substrate to a distal surface of the first pad-level dielectric layer, and includes a respective first pad-level ring structure that continuously extends around the first semiconductor devices. At least one row of first dummy metal pads is embedded in the first pad-level dielectric layer between a respective pair of first edge seal structures. Second pad-level ring structures embedded in a second semiconductor die can be bonded to the rows of first dummy metal pads.

20 Claims, 34 Drawing Sheets

(51) Int. Cl.
*H01L 23/58* (2006.01)
*H01L 25/18* (2006.01)
*H01L 25/00* (2006.01)
*H01L 23/528* (2006.01)

(52) U.S. Cl.
CPC ......... *H01L 2224/06515* (2013.01); *H01L 2224/08147* (2013.01); *H01L 2224/80895* (2013.01); *H01L 2924/14511* (2013.01); *H01L 2924/2064* (2013.01)

(56) References Cited

U.S. PATENT DOCUMENTS

| | | | |
|---|---|---|---|
| 10,312,201 | B1 | 6/2019 | Hu et al. |
| 10,319,635 | B2 | 6/2019 | Nosho et al. |
| 10,354,980 | B1 | 7/2019 | Mushiga et al. |
| 10,354,987 | B1 | 7/2019 | Mushiga et al. |
| 10,381,322 | B1 | 8/2019 | Azuma et al. |
| 10,381,362 | B1 | 8/2019 | Cui et al. |
| 10,381,373 | B2 | 8/2019 | Okizumi et al. |
| 10,510,738 | B2 | 12/2019 | Kim et al. |
| 2015/0279888 | A1 | 10/2015 | Chen et al. |
| 2018/0342455 | A1 | 11/2018 | Nosho et al. |
| 2018/0366487 | A1 | 12/2018 | Okizumi et al. |
| 2019/0221557 | A1 | 7/2019 | Kim et al. |
| 2019/0252361 | A1 | 8/2019 | Nishida |
| 2020/0066745 | A1 | 2/2020 | Yu et al. |

OTHER PUBLICATIONS

U.S. Appl. No. 16/248,923, filed Jan. 16, 2019, SanDisk Technologies LLC.
U.S. Appl. No. 16/249,423, filed Jan. 16, 2019, SanDisk Technologies LLC.
U.S. Appl. No. 16/251,782, filed Jan. 18, 2019, SanDisk Technologies LLC.
U.S. Appl. No. 16/255,413, filed Jan. 23, 2019, SanDisk Technologies LLC.
U.S. Appl. No. 16/269,301, filed Feb. 6, 2019, SanDisk Technologies LLC.
U.S. Appl. No. 16/274,687, filed Feb. 13, 2019, SanDisk Technologies LLC.
U.S. Appl. No. 16/275,668, filed Feb. 14, 2019, SanDisk Technologies LLC.
U.S. Appl. No. 16/278,372, filed Feb. 18, 2019, SanDisk Technologies LLC.
U.S. Appl. No. 16/288,656, filed Feb. 19, 2019, SanDisk Technologies LLC.
U.S. Appl. No. 16/291,457, filed Mar. 4, 2019, SanDisk Technologies LLC.
U.S. Appl. No. 16/291,504, filed Mar. 4, 2019, SanDisk Technologies LLC.
U.S. Appl. No. 16/291,577, filed Mar. 4, 2019, SanDisk Technologies LLC.
U.S. Appl. No. 16/295,292, filed Mar. 7, 2019, SanDisk Technologies LLC.
U.S. Appl. No. 16/372,908, filed Apr. 2, 2019, SanDisk Technologies LLC.
U.S. Appl. No. 16/385,010, filed Apr. 16, 2019, SanDisk Technologies LLC.
U.S. Appl. No. 16/391,632, filed Apr. 23, 2019, SanDisk Technologies LLC.
U.S. Appl. No. 16/409,593, filed May 10, 2019, SanDisk Technologies LLC.
U.S. Appl. No. 16/417,913, filed May 21, 2019, SanDisk Technologies LLC.
U.S. Appl. No. 16/440,183, filed Jun. 13, 2019, SanDisk Technologies LLC.
U.S. Appl. No. 16/521,849, filed Jul. 25, 2019, SanDisk Technologies LLC.
U.S. Appl. No. 16/523,029, filed Jul. 26, 2019, SanDisk Technologies LLC.
U.S. Appl. No. 16/552,089, filed Aug. 27, 2019, SanDisk Technologies LLC.
U.S. Appl. No. 16/589,404, filed Oct. 1, 2019, SanDisk Technologies LLC.
U.S. Appl. No. 16/660,177, filed Oct. 22, 2019, SanDisk Technologies LLC.
U.S. Appl. No. 16/666,522, filed Oct. 29, 2019, SanDisk Technologies LLC.
U.S. Appl. No. 16/671,025, filed Oct. 31, 2019, SanDisk Technologies LLC.
U.S. Appl. No. 16/682,848, filed Nov. 13, 2019, SanDisk Technologies LLC.
U.S. Appl. No. 16/694,340, filed Nov. 25, 2019, SanDisk Technologies LLC.
U.S. Appl. No. 16/694,400, filed Nov. 25, 2019, SanDisk Technologies LLC.
U.S. Appl. No. 16/694,438, filed Nov. 25, 2019, SanDisk Technologies LLC.
U.S. Appl. No. 16/728,327, filed Dec. 27, 2019, SanDisk Technologies LLC.
U.S. Appl. No. 16/742,213, filed Jan. 14, 2020, SanDisk Technologies LLC.
U.S. Appl. No. 16/747,943, filed Jan. 21, 2020, SanDisk Technologies LLC.
U.S. Appl. No. 16/774,372, filed Jan. 28, 2020, SanDisk Technologies LLC.
U.S. Appl. No. 16/774,446, filed Jan. 28, 2020, SanDisk Technologies LLC.
U.S. Appl. No. 16/806,087, filed Mar. 2, 2020, SanDisk Technologies LLC.
U.S. Appl. No. 16/825,304, filed Mar. 20, 2020, SanDisk Technologies LLC.
U.S. Appl. No. 16/825,397, filed Mar. 20, 2020, SanDisk Technologies LLC.
U.S. Appl. No. 16/838,283, filed Apr. 2, 2020, SanDisk Technologies LLC.
U.S. Appl. No. 16/838,320, filed Apr. 2, 2020, SanDisk Technologies LLC.
Notification of Transmittal of the International Search Report and the Written Opinion of the International Searching Authority for International Patent Application No. PCT/US2020/067193, dated Apr. 18, 2021, 12 pages.

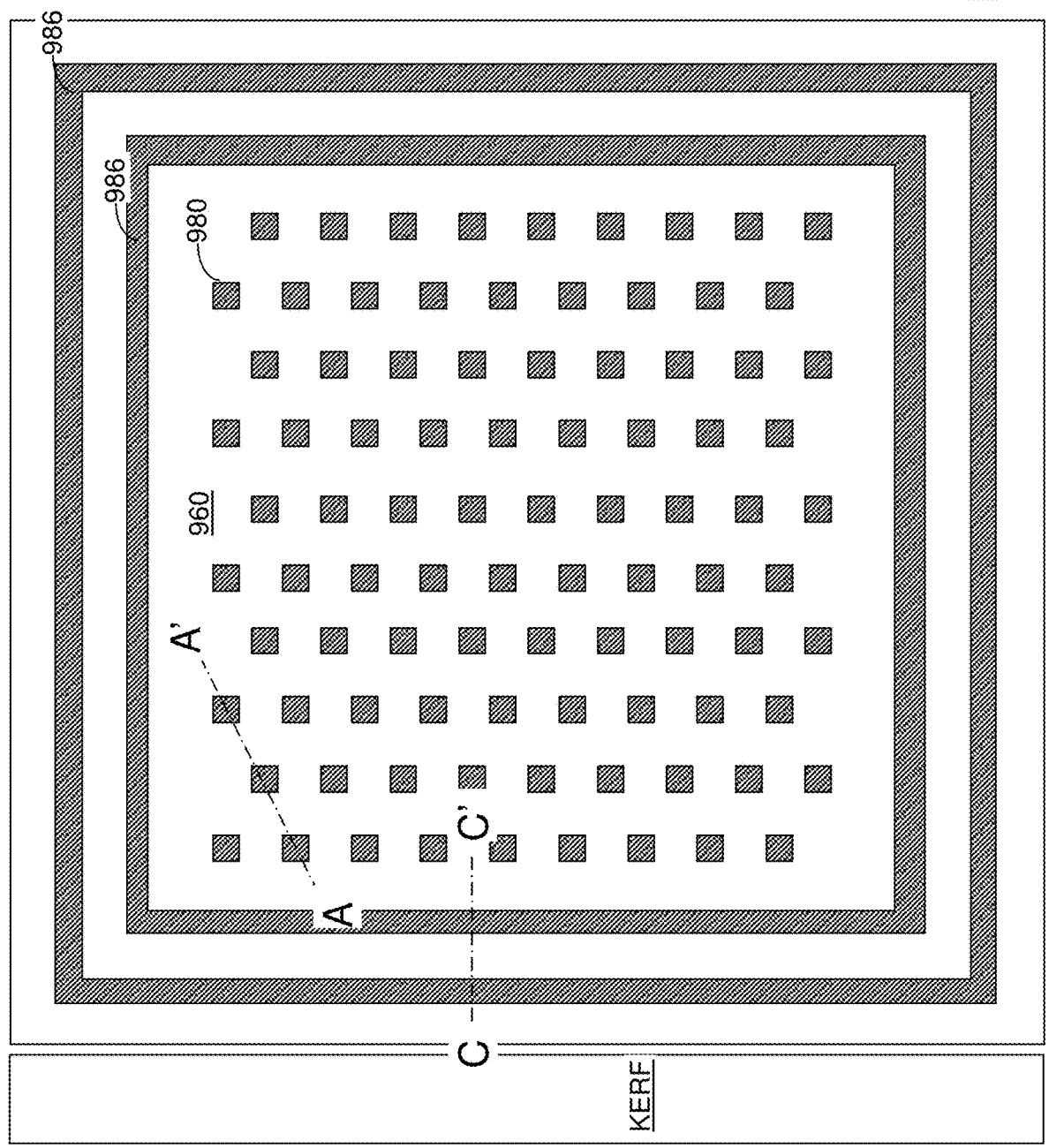

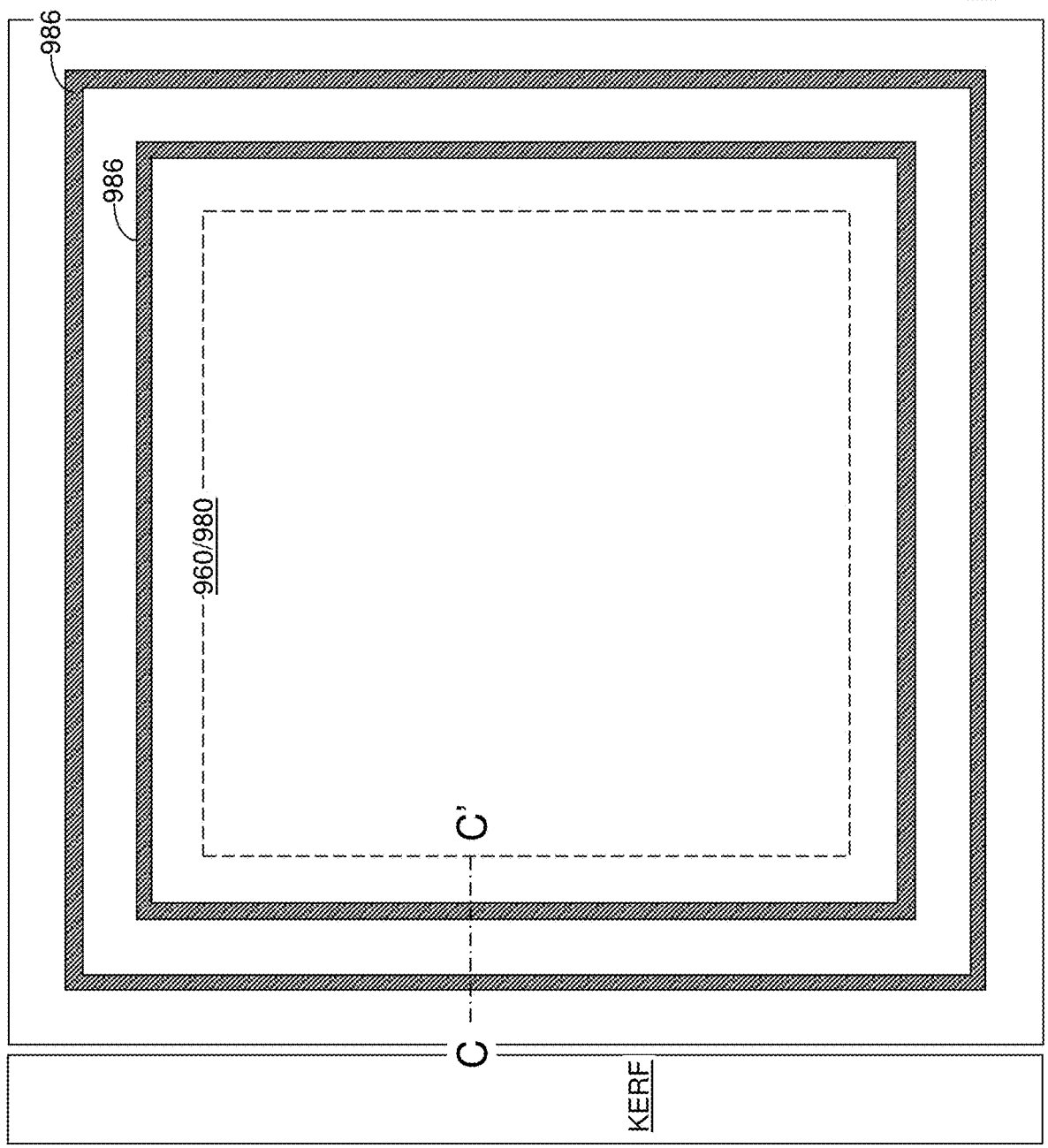

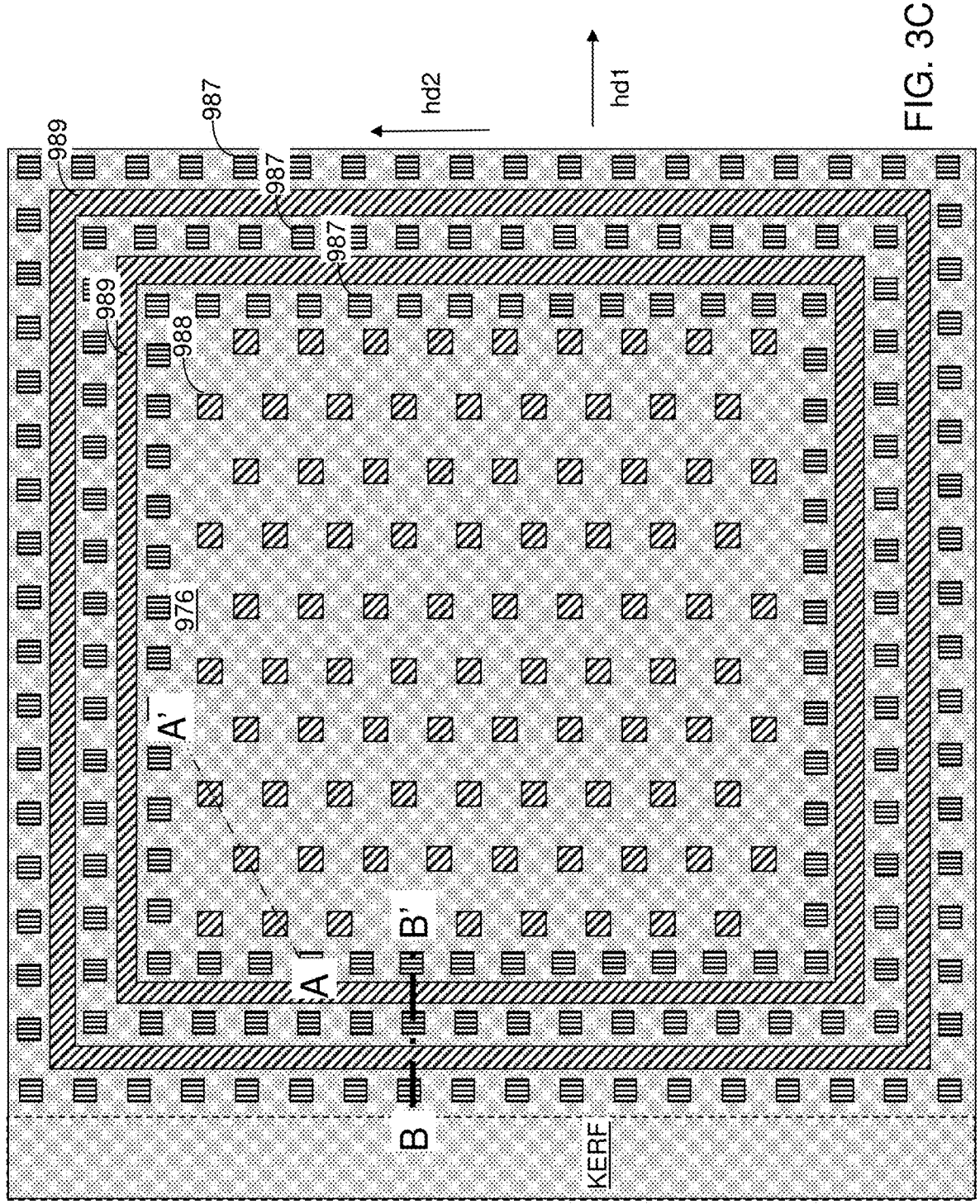

SEMICONDUCTOR DIE CONTAINING DUMMY METALLIC PADS AND METHODS OF FORMING THE SAME

FIELD

The present disclosure relates generally to the field of semiconductor devices, and particularly to a semiconductor die including dummy metallic pads for edge seal enhancement and methods for forming the same.

BACKGROUND

A semiconductor memory device may include a memory array and driver circuit located on the same substrate. However, the driver circuit takes up valuable space on the substrate, thus reducing the space available for the memory array.

SUMMARY

According to an aspect of the present disclosure, a structure comprising a first semiconductor die is provided. The first semiconductor die comprises: first semiconductor devices located over a first substrate; first interconnect-level dielectric layers embedding first metal interconnect structures and located over the first semiconductor devices; a first pad-level dielectric layer embedding first bonding pads and located over the first interconnect-level dielectric layers; first edge seal structures laterally surrounding the first semiconductor devices, wherein each of the first edge seal structures vertically extends from the first substrate to a horizontal plane including bonding surfaces of the first bonding pads, and comprises a respective first pad-level ring structure that continuously extends around the first semiconductor devices; and at least one row of first dummy metal pads embedded in the first pad-level dielectric layer, wherein the first dummy metal pads are not electrically connected to the first edge seal structures or to the first metal interconnect structures.

According to another aspect of the present disclosure, a method of forming a structure is provided. The method comprises forming a first semiconductor die by forming first semiconductor devices over a first substrate; forming first interconnect-level dielectric layers embedding first metal interconnect structures over the first semiconductor devices; and forming a first pad-level dielectric layer embedding first bonding pads, first edge seal structures which comprise first pad-level ring structures, and at least one row of first dummy metal pads over the first interconnect-level dielectric layers. The first edge seal structures laterally surround the first semiconductor devices; each of the first edge seal structures vertically extends from the first substrate to a horizontal plane including bonding surfaces of the first bonding pads; and a row of first dummy metal pads is formed between a pair of first edge seal structures.

BRIEF DESCRIPTION OF THE DRAWINGS

FIG. 1B is top-down view of the first semiconductor die of FIG. 1A. The vertical plane A-A' represents the device region shown in FIG. 1A.

FIG. 1E is horizontal cross-sectional view of the first semiconductor die of FIG. 1A-1C along the horizontal plane E-E' of FIG. 1C.

FIG. 3C is top-down view of the first semiconductor die of FIGS. 3A and 3B.

DETAILED DESCRIPTION

Figure 1A:
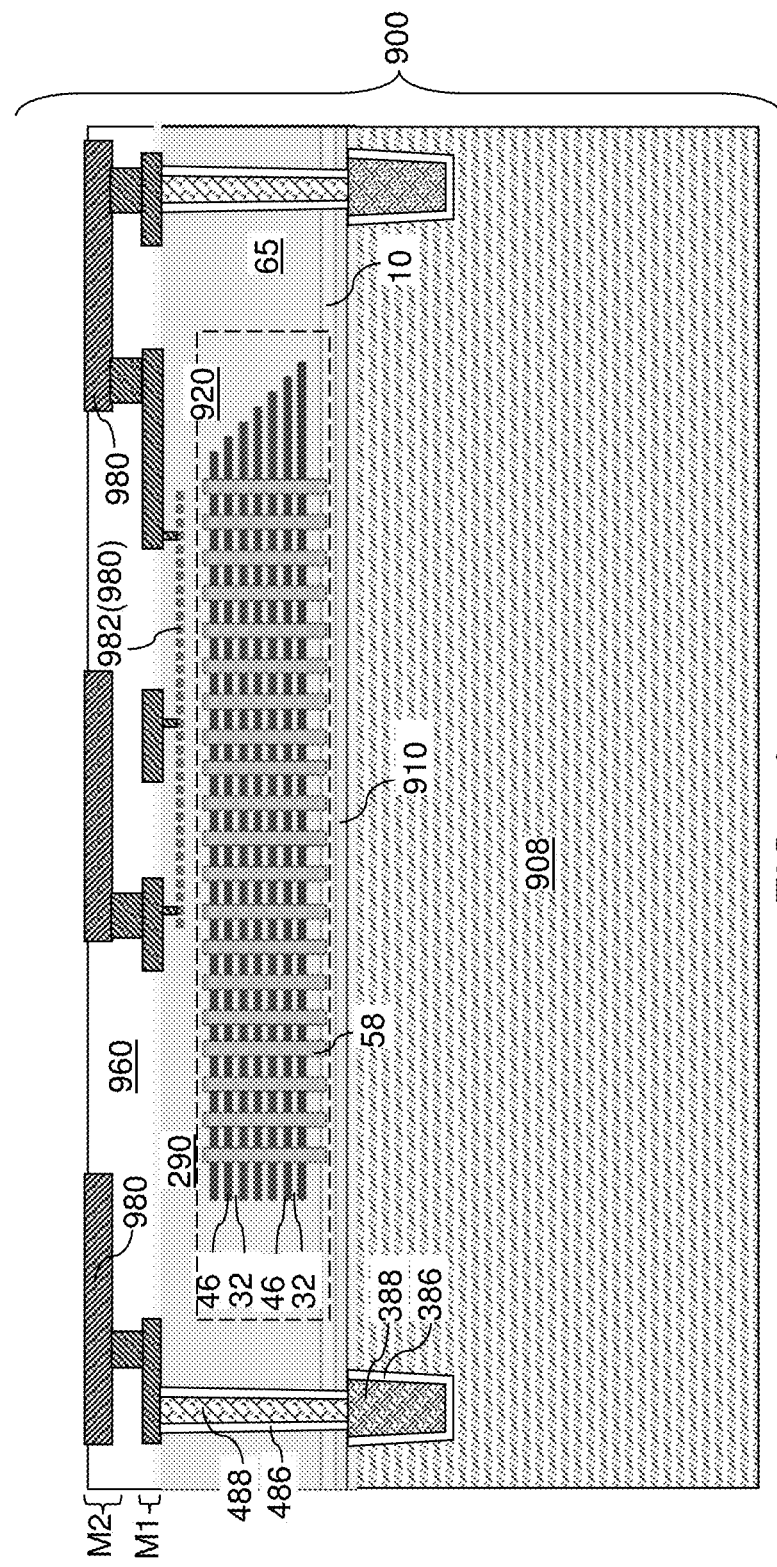
FIG. 1A is a schematic vertical cross-sectional view of a device region of a first semiconductor die after formation of interconnect-level dielectric layers according to an embodiment of the present disclosure.
Figure 1C:
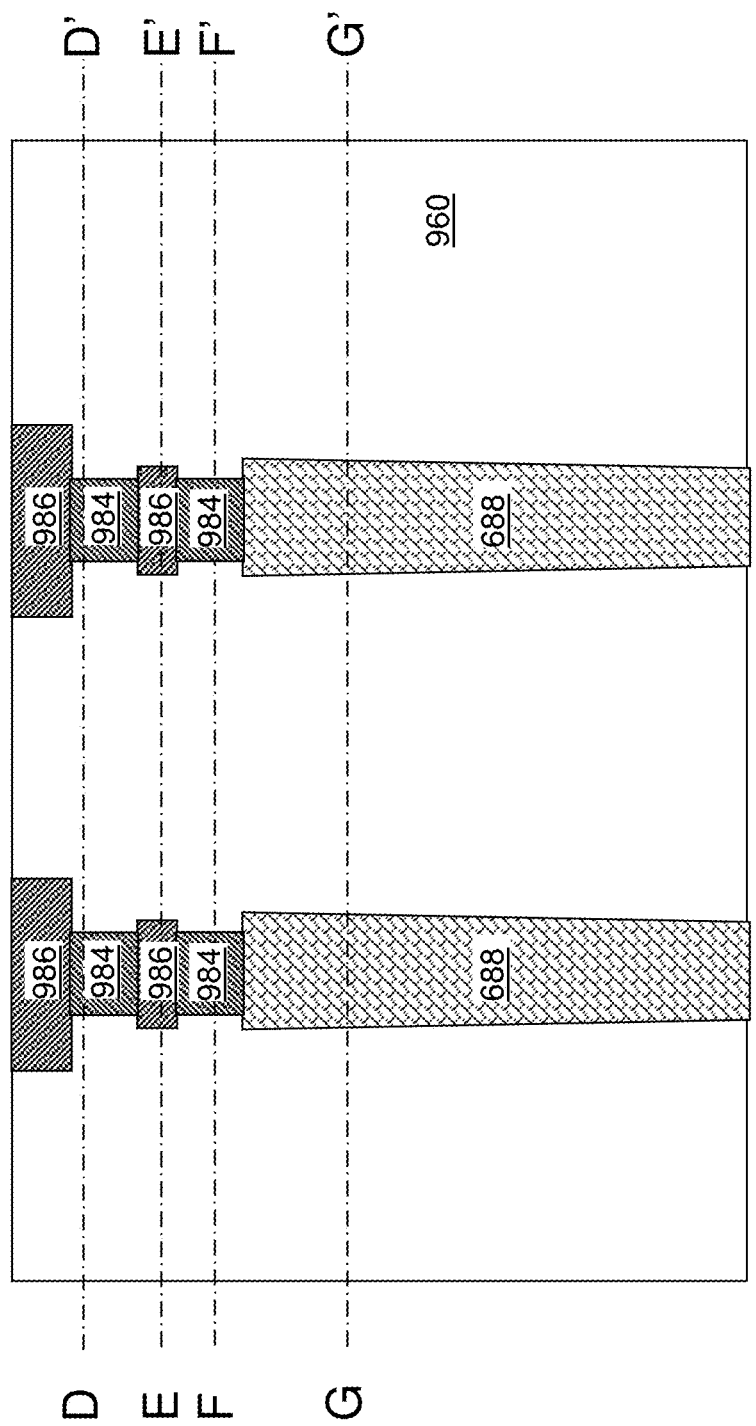
FIG. 1C is a schematic vertical cross-sectional view of a region of the first semiconductor die of FIGS. 1A and 1B along the vertical plane C-C' of FIG. 1B.
Figure 1D:
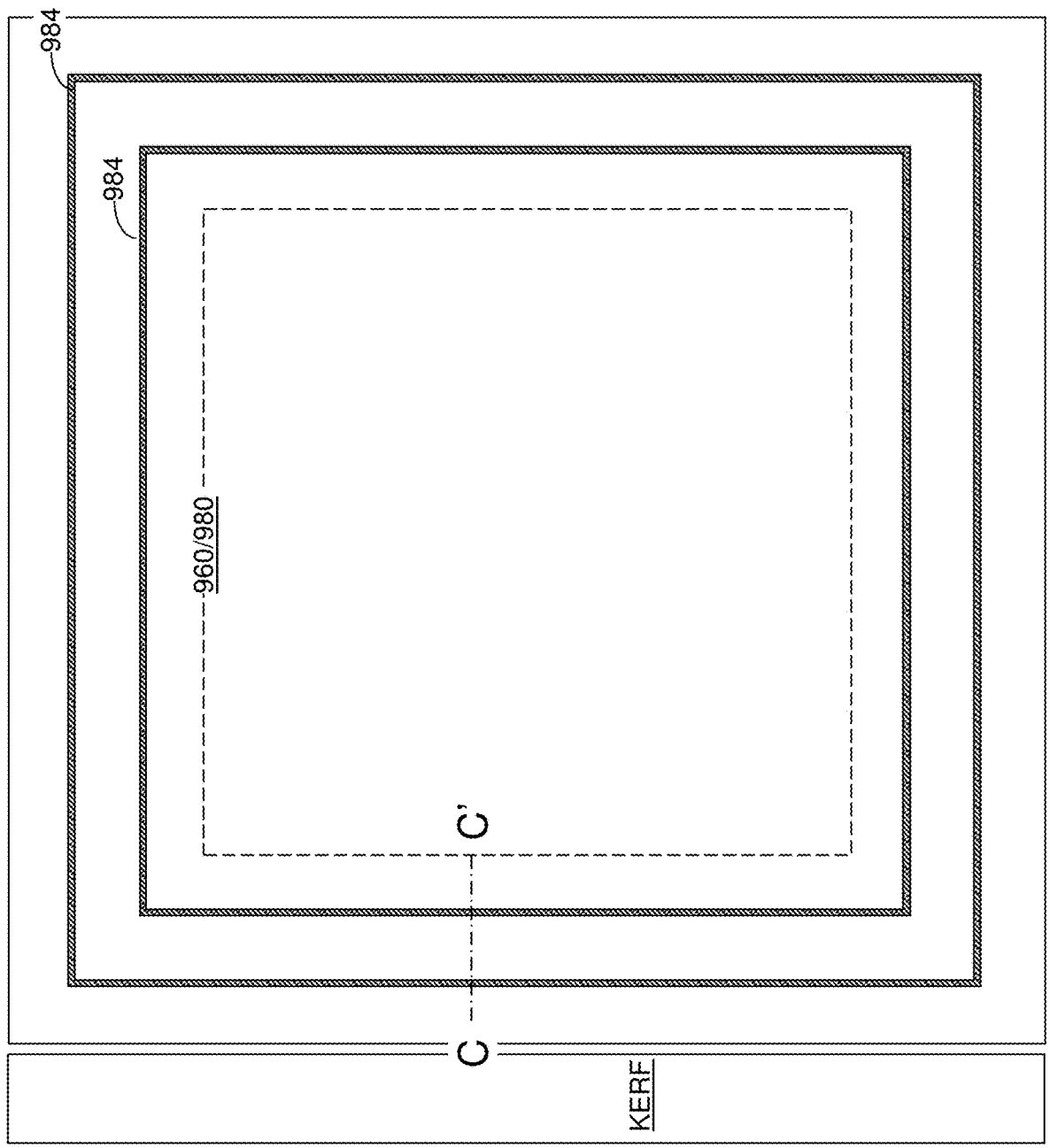
FIG. 1D is horizontal cross-sectional view of the first semiconductor die of FIG. 1A-1C along the horizontal plane D-D' of FIG. 1C.
Figure 1F:
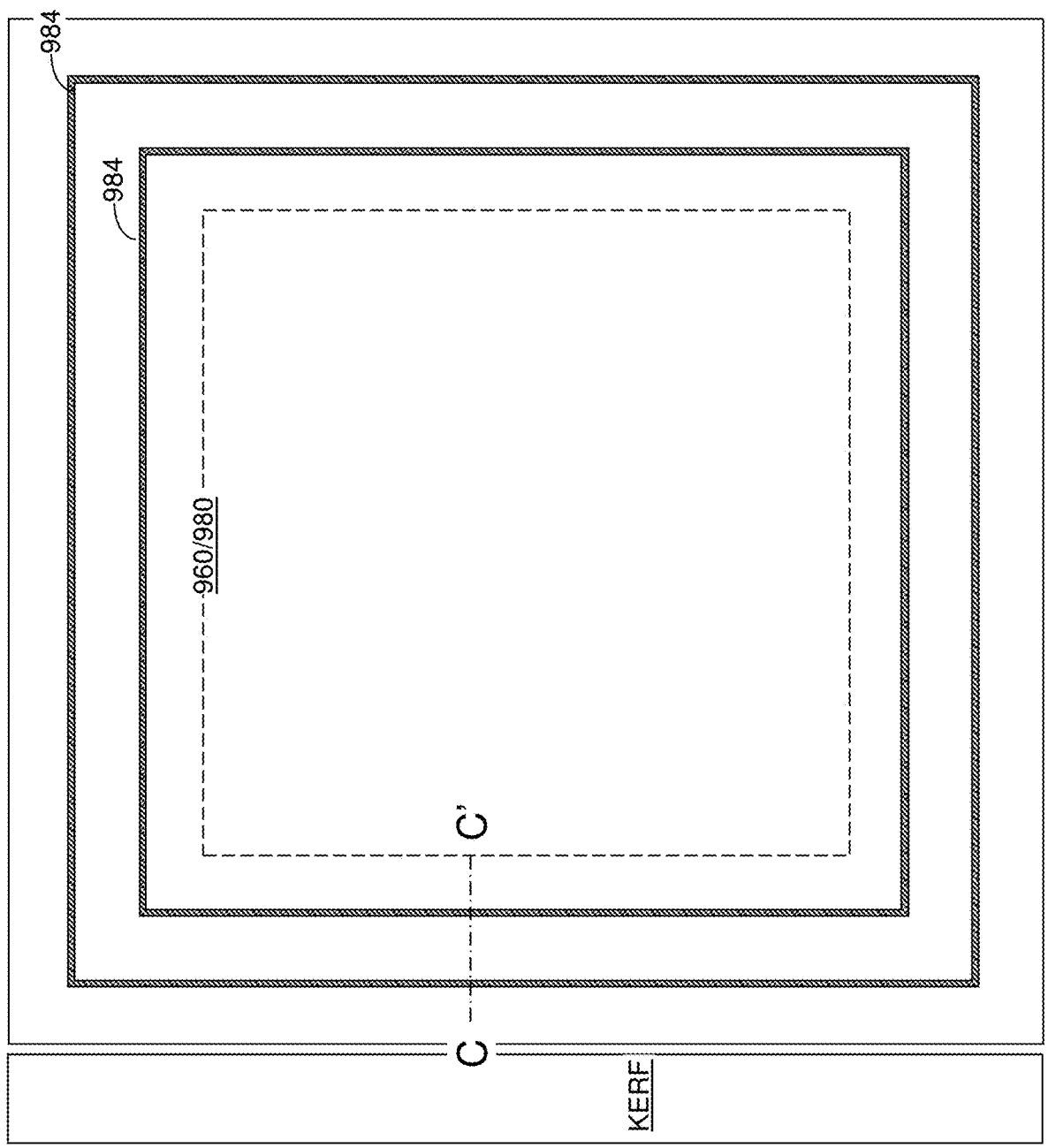
FIG. 1F is horizontal cross-sectional view of the first semiconductor die of FIG. 1A-1C along the horizontal plane F-F' of FIG. 1C.
Figure 1G:
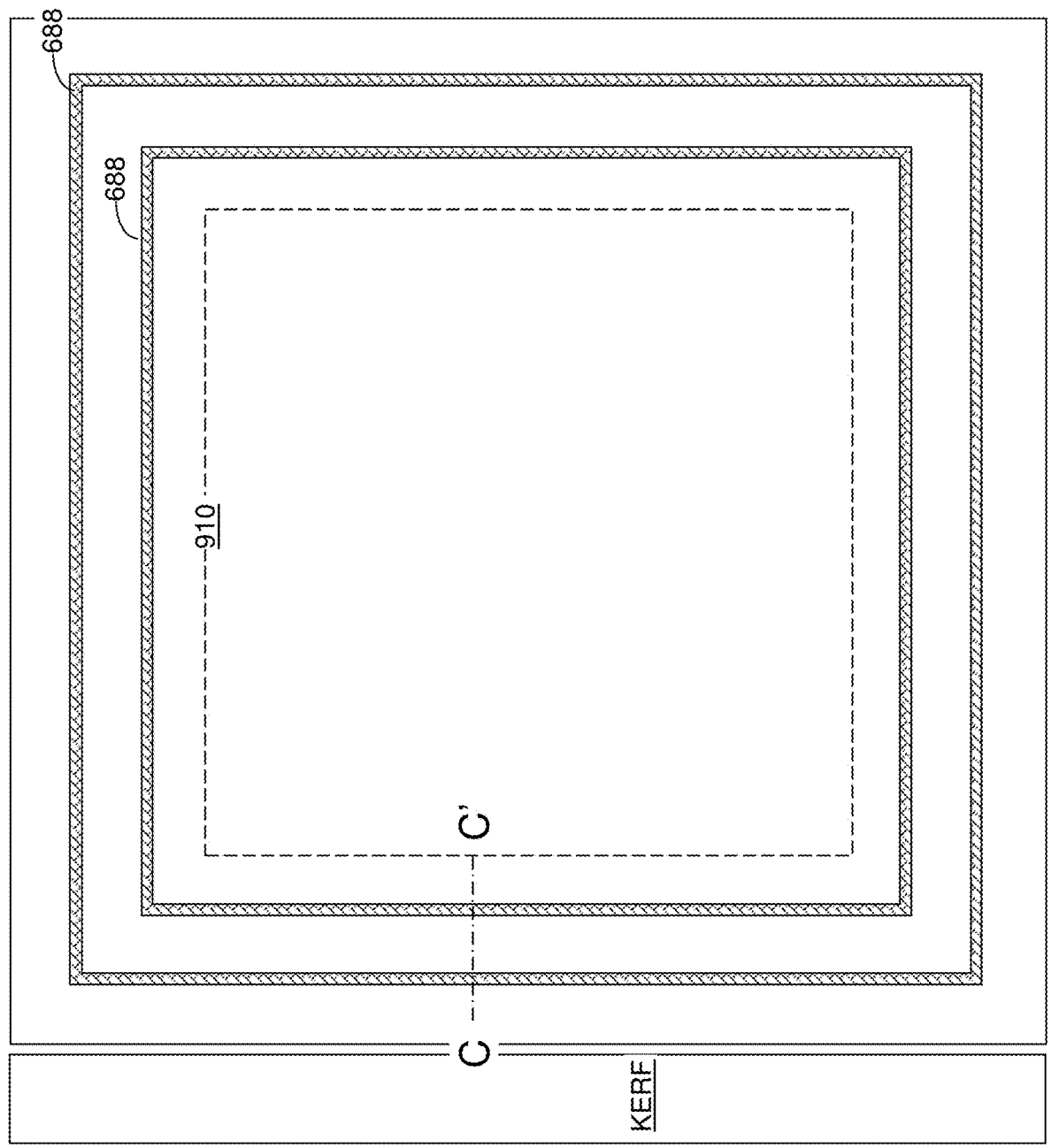
FIG. 1G is horizontal cross-sectional view of the first semiconductor die of FIG. 1A-1C along the horizontal plane G-G' of FIG. 1C.

A driver circuit may be formed on a separate semiconductor die from the memory device, and semiconductor dies can be bonded to each other through metal-to-metal bonding between two sets of metal bonding pads. Presence of continuously extending metal pads located in bonding surfaces of the semiconductor dies has an adverse effect on bonding due to dishing of the pads after planarization, which leads to voids and reduced bonding strength. Thus, prior art bonding pads are not continuous to avoid dishing. However, discontinuous bonding pads leave regions between the pads which are susceptible to ingress of moisture and contaminants from outside the bonded assembly of the two dies. The embodiments of the present disclosure provide a semiconductor die containing dummy metallic pads in an edge seal structure that more effectively blocks diffusion of moisture and/or contaminants without significantly weakening the bonding strength at edges of the bonded assembly.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^{5}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m.

As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{5}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIGS. 1A-1G, a first semiconductor die 900 in a first configuration is illustrated. FIGS. 1B and 1D-1G corresponds to a view of the entire area of the first semiconductor die 900 and an adjacent kerf area that is subsequently removed during a die singulation process. The first semiconductor die 900 includes a first substrate 908, first semiconductor devices 920 overlying the first substrate 908, first interconnect-level dielectric material layers (290, 960) overlying the first semiconductor devices, and first metal interconnect structures 980 embedded in the first interconnect-level dielectric material layers (290, 960). In one embodiment, the first substrate 908 may be a first substrate such as a commercially available silicon wafer having a thickness in a range from 500 microns to 2 mm.

Discrete substrate recess cavities can be formed in an upper portion of the first substrate 908 by applying a photoresist layer over the top surface of the first substrate 908, lithographically patterning the photoresist layer to form an array of discrete openings, and transferring the pattern of the array of discrete openings into the upper portion of the first substrate by performing an anisotropic etch process. The photoresist layer can be subsequently removed, for example, by ashing. The depth of each discrete substrate recess cavity can be in a range from 500 nm to 10,000, although lesser and greater depths can also be employed. A through-substrate liner 386 and a through-substrate via structure 388 can be formed within each discrete substrate recess cavity.

Generally, the first semiconductor devices 920 may comprise any semiconductor device known in the art. In one embodiment, the first semiconductor die 900 comprises a memory die, and may include memory devices, such as a three-dimensional NAND memory device. In an illustrative example, the first semiconductor devices 920 may include a vertically alternating stack of insulating layers 32 and electrically conductive layers 46, and a two-dimensional array of memory openings vertically extending through the vertically alternating stack (32, 46). The electrically conductive layers 46 may comprise word lines of the three-dimensional NAND memory device.

A memory opening fill structure 58 may be formed within each memory opening. A memory opening fill structure 58 may include a memory film and a vertical semiconductor channel contacting the memory film. The memory film may include a blocking dielectric, a tunneling dielectric and a charge storage material located between the blocking and tunneling dielectric. The charge storage material may comprise charge trapping layer, such as a silicon nitride layer, or a plurality of discrete charge trapping regions, such as floating gates or discrete portions of a charge trapping layer. In this case, each memory opening fill structure 58 and adjacent portions of the electrically conductive layers 46 constitute a vertical NAND string. Alternatively, the memory opening fill structures 58 may include any type of non-volatile memory elements such as resistive memory elements, ferroelectric memory elements, phase change memory elements, etc. The memory device may include an optional horizontal semiconductor channel layer 10 connected to the bottom end of each vertical semiconductor channel, and an optional dielectric spacer layer 910 that provides electrical isolation between the first substrate 908 and the horizontal semiconductor channel layer 10.

The electrically conductive layers 46 may be patterned to provide a terrace region in which each overlying electrically conductive layer 46 has a lesser lateral extent than any underlying electrically conductive layer 46. Contact via structures (not shown) may be formed on the electrically conductive layers 46 in the terrace region to provide electrical connection to the electrically conductive layers 46. Dielectric material portions 65 may be formed around each vertically alternating stack (32, 46) to provide electrical isolation among neighboring vertically alternating stacks (32, 46).

Through-memory-level via cavities can be formed through the dielectric material portions 65, the optional dielectric spacer layer 910, and the horizontal semiconductor channel layer 10. An optional through-memory-level dielectric liner 486 and a through-memory-level via structure 488 can be formed within each through-memory-level via cavity. Each through-memory-level dielectric liner 486 includes a dielectric material such as silicon oxide. Each through-memory-level via structure 488 can be formed directly on a respective one of the through-substrate via structure 388.

The first interconnect-level dielectric material layers (290, 960) may include first proximal interconnect-level dielectric material layers 290 embedding contact via structures and bit lines 982 and first distal interconnect-level dielectric material layers 960 that embed a subset of the first metal interconnect structures 980 located above the first proximal interconnect-level dielectric material layers 290. The bit lines 982 are a subset of the first metal interconnect structures 980 and may electrically contact drain regions located above the semiconductor channel at the top of the memory opening fill structures 58. The contact via structures contact various nodes of the first semiconductor devices. Generally, the first metal interconnect structures 980 can be electrically connected to the first semiconductor devices 920. A proximal subset of the first metal interconnect structures 980 can be located within the first distal interconnect-level dielectric material layers 960. Interconnect metal lines and interconnect metal via structures, which are subsets of the first metal interconnect structures 980, can be embedded in the first distal interconnect-level dielectric material layers 960. In an illustrative example, the first metal interconnect structures 980 may include a first memory-side metal level M1 including memory-side first-level metal lines, and a second memory-side metal level M2 including memory-side second-level metal lines.

Each of the first proximal interconnect-level dielectric material layers 290 and the first distal interconnect-level dielectric material layers 960 may include a dielectric material such as undoped silicate glass, a doped silicate glass, organosilicate glass, silicon nitride, a dielectric metal oxide, or a combination thereof. The first distal interconnect-level dielectric material layers 960 may include one or more dielectric diffusion barrier layers (not expressly shown). In this case, each dielectric diffusion barrier layer embedded in the first distal interconnect-level dielectric material layers 960 may include silicon carbon nitride (i.e., silicon carbonitride "SiCN", which is also referred to silicon carbide nitride), silicon nitride ($Si_3N_4$), silicon oxynitride, or any other dielectric material that is effective in blocking diffusion of copper. In one embodiment, each dielectric diffusion barrier layer embedded in the first distal interconnect-level dielectric material layers 960 may include a dielectric material having a dielectric constant less than 5, such as SiCN having a dielectric constant of about 3.8, to reduce RC delay of the first metal interconnect structures 980. Each dielectric diffusion barrier layer may have a thickness in a range from 10 nm to 300 nm.

At least one first edge seal structure (688, 984, 986) can be formed around the periphery of the first semiconductor die 900 through the dielectric material portions 65 and the first interconnect-level dielectric material layers (290, 960). For example, at least one moat trench vertically extending through the dielectric material portions 65 and optionally through a lower level of the first interconnect-level dielectric material layers (290, 960) can be formed, and can be subsequently filled with at least one metallic material to form at least one first metallic moat via structure 688. A plurality of nested first metallic moat via structures 688 can be formed. Each first metallic moat via structure 688 continuous extends along the periphery of the first semiconductor die 900, and completely laterally encloses the first semiconductor devices 920. The entire bottom surface of each first metallic moat via structure 688 can contact the top surface of the first substrate 908.

Each of the at least one first edge seal structure (688, 984, 986) can include metallic ring structures (984, 986). The metallic ring structures (984, 986) can include at least one first via-level ring structure 984 that overlies a respective one of the at least one first metallic moat via structure 688 that is formed at a respective metal via level. Further, the metallic ring structures (984, 986) in each first edge seal structure (688, 984, 986) can include at least one first line-level ring structure 986. Each first line-level ring structure 986 overlies a respective one of the at least one first metallic moat via structure 688 and is formed at a respective metal line level. Generally, each first edge seal structure (688, 984, 986) includes at least one continuous set of conductive material portions that vertically extends from the first substrate 908 to the top surface of the first interconnect-level dielectric material layers (290, 960). Each first edge seal structure (688, 984, 986) includes a continuous set of conductive material portions that laterally surrounds the first semiconductor devices 920 without any opening therethrough.

In one embodiment, each of the at least one first edge seal structure (688, 984, 986) can include a first metallic moat via structure 688 and a respective subset of the ring structures (984, 986) that provides a respective continuous barrier laterally surrounding the first semiconductor devices 920 without any lateral opening. Each of the at least one first edge seal structure (688, 984, 986) vertically extends from the first substrate 908 to the topmost surface of the first distal interconnect-level dielectric material layers 980. Each subset of the first metal interconnect structures 980 within a first edge seal structure (688, 984, 986) can include at least one first line-level ring structure 986 and at least one first via-level ring structure 984. Each first line-level ring structure 986 can be formed at a metal line level as a single continuous annular structure that laterally encloses the entirety of the first semiconductor structures 920. Each via-level ring structure 984 can be formed at a metal via level as a single continuous annular structure that laterally encloses the entirety of the first semiconductor structures 920.

The first metallic moat via structures 688 contact a respective annular peripheral portion of a top surface of the first substrate 908 and laterally surrounds the first semiconductor devices 920. Vertical stacks of metallic ring structures (984, 986) vertically extend from an annular top surface of the respective one of the first metallic moat via structures 688 to a topmost surface of the first interconnect-level dielectric material layers (290, 960). Each of the first edge seal structures (688, 984, 986) can comprise: a respective first metallic moat via structure 688 that contacts a respective annular peripheral portion of the top surface of the first substrate 908, and a respective vertical stack of metallic ring structures (984, 986) that vertically extends from an annular top surface of the respective first metallic moat via structure 688 to a topmost surface of the first interconnect-level dielectric material layers (290, 260). Each of the metallic ring structures (984, 986) can be formed concurrently with a respective subset of the first metal interconnect structures 980 that are formed at the same level, and can have a same vertical thickness and a same material composition as a respective one of the first metal interconnect structures 980 having a same vertical separation distance from the first substrate 908 (i.e., located at the same level).

Figure 2A:
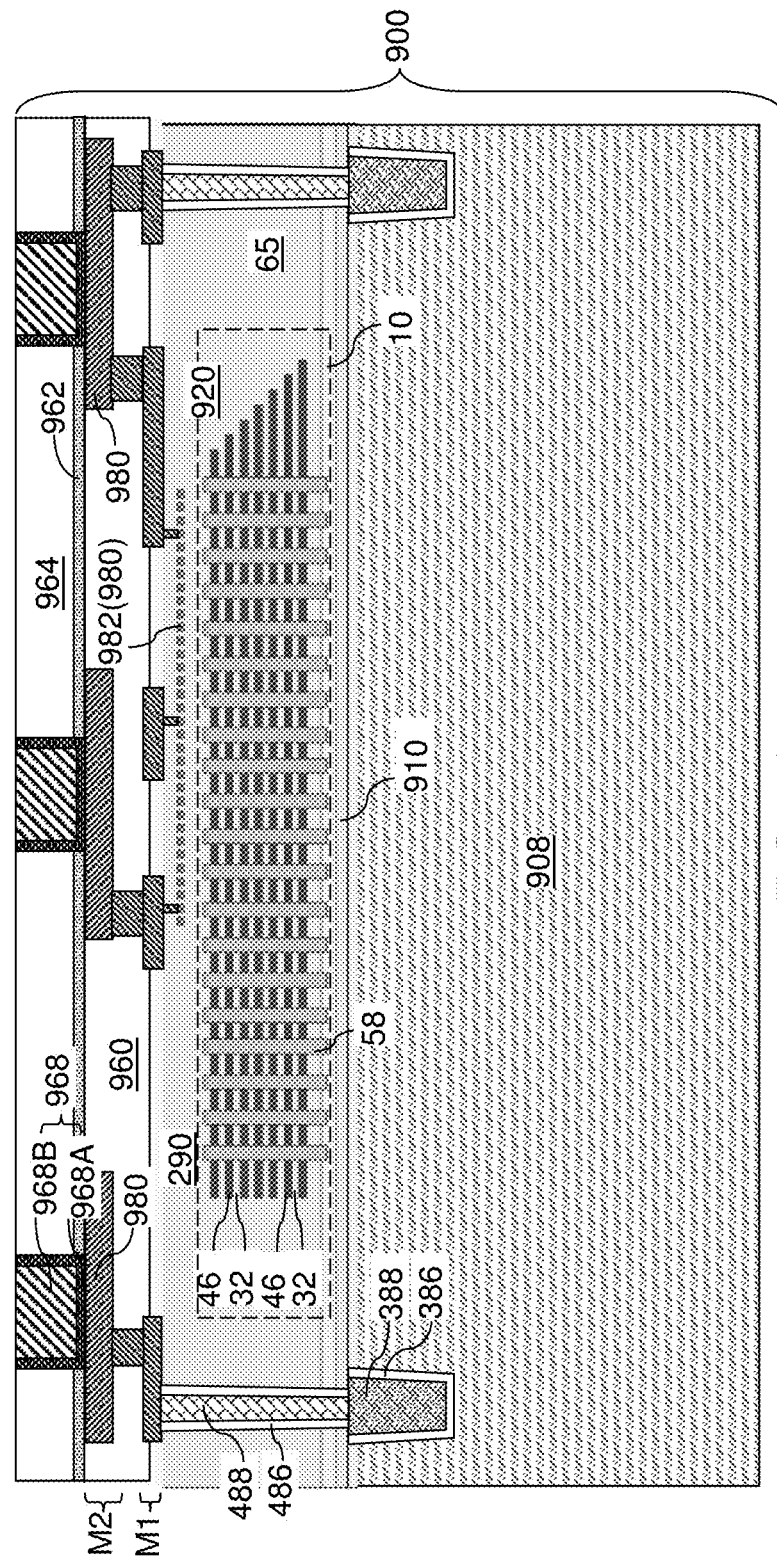
FIG. 2A a schematic vertical cross-sectional view of a device region of the first semiconductor die after formation of a first pad-connection-level dielectric layer and first pad-connection via structures according to an embodiment of the present disclosure.
Figure 2B:
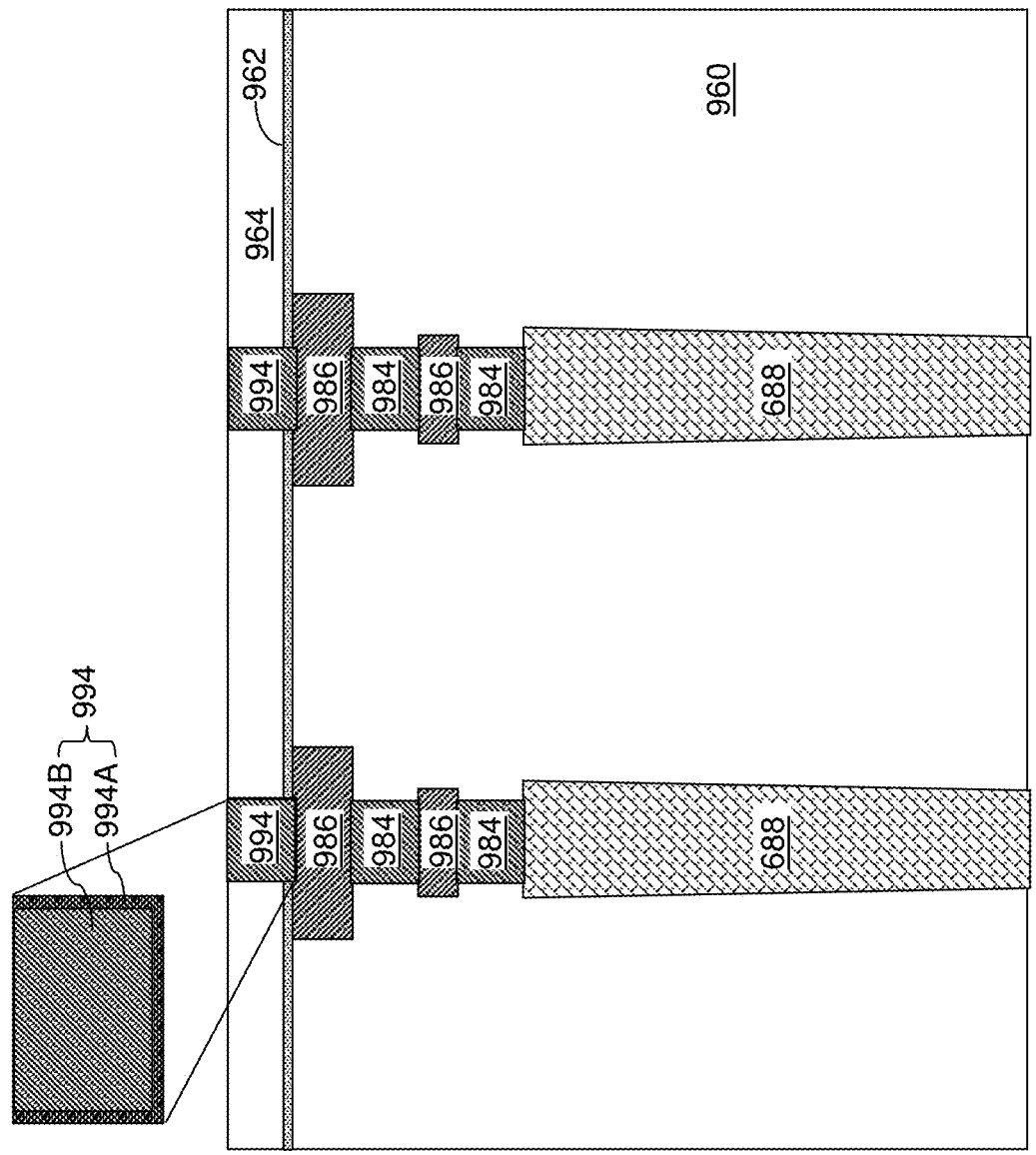
FIG. 2B is a vertical cross-sectional view of a peripheral region of the first semiconductor die of FIG. 2A.
Figure 2C:
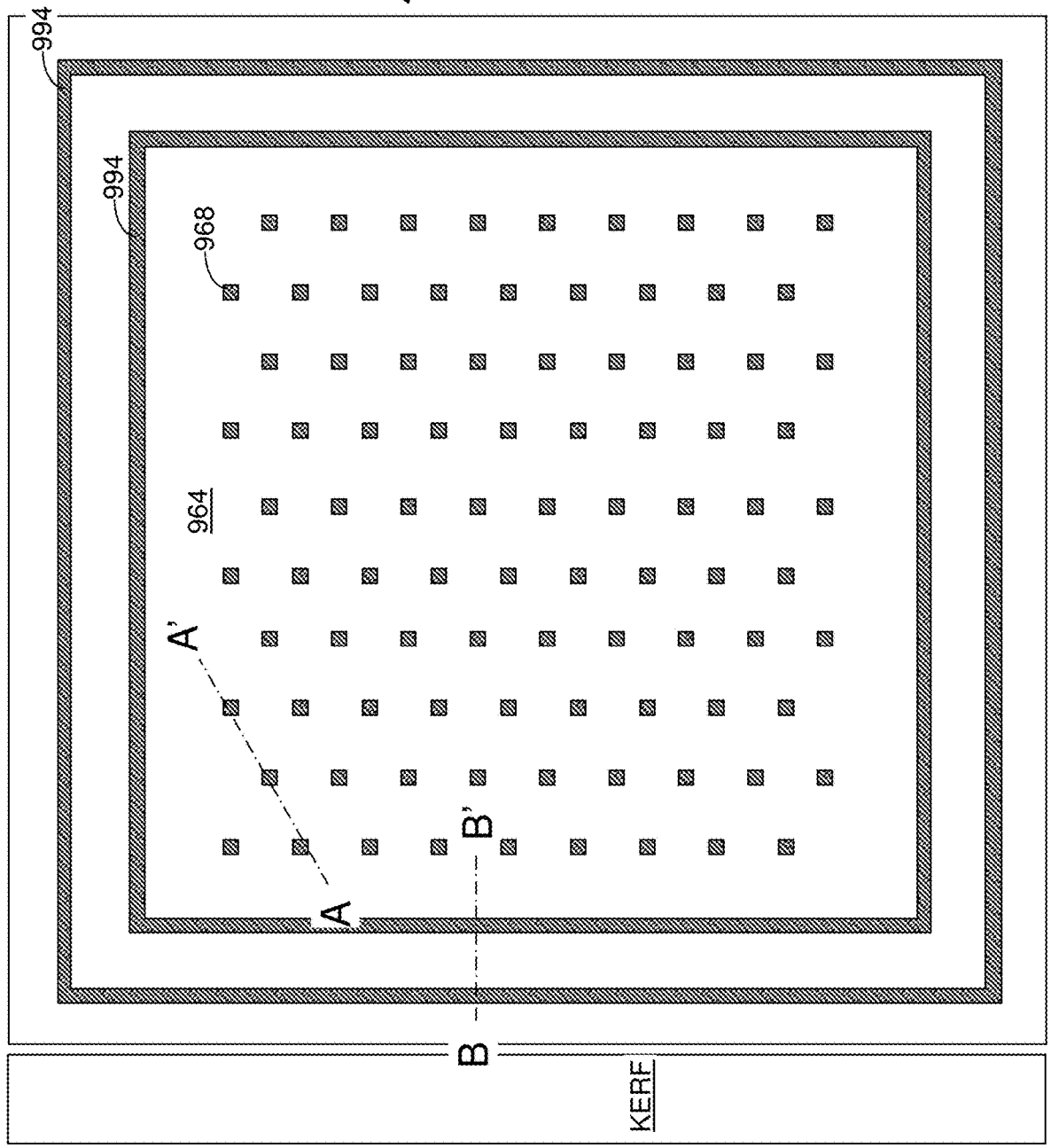
FIG. 2C is top-down view of the first semiconductor die of FIGS. 2A and 2B.

Referring to FIGS. 2A-2C, a layer stack including a first interconnect-capping dielectric diffusion barrier layer 962 and a first pad-connection-level dielectric layer 964 can be formed. The first interconnect-capping dielectric diffusion barrier layer 962 can include a dielectric material that blocks copper diffusion. In one embodiment, the first interconnect-capping dielectric diffusion barrier layer 962 can include silicon nitride, silicon carbon nitride, silicon oxynitride, or a stack thereof. In one embodiment, the first interconnect-capping dielectric diffusion barrier layer 962 can include a dielectric material having a dielectric constant less than 5, such as silicon carbide nitride that has a dielectric constant of about 3.8. The thickness of the first interconnect-capping dielectric diffusion barrier layer 962 can be in a range from 5 nm to 50 nm, although lesser and greater thicknesses can also be employed.

The first pad-connection-level dielectric layer 964 may include, and/or consist essentially of, undoped silicate glass (i.e., silicon oxide), a doped silicate glass, organosilicate glass, silicon nitride, or a dielectric metal oxide. The thickness of the first pad-connection-level dielectric layer 964 may be in a range from 100 nm to 3,000 nm, although lesser and greater thicknesses may also be employed. The first pad-connection-level dielectric layer 964 may have a planar top surface.

A photoresist layer (not shown) can be applied over the first pad-connection-level dielectric layer 964, and can be lithographically patterned to form discrete openings in areas that overlie topmost metal interconnect structures of the first metal interconnect structures 980. Further, ring-shaped openings can be formed in the photoresist layer in areas that overlie the first edge seal structures (688, 984, 986). Each ring-shaped opening can be formed over a respective vertical stack of metallic ring structures (984, 986).

An anisotropic etch process can be performed to transfer the pattern of the openings in the photoresist layer through the first pad-connection-level dielectric layer 964 and the first interconnect-capping dielectric diffusion barrier layer 962. First pad-connection via cavities are formed through the first pad-connection-level dielectric layer 964 and first interconnect-capping dielectric diffusion barrier layer 962 in areas that overlie metal interconnect structures 980 and the first edge seal structures (688, 984, 986). A top surface of a topmost metal interconnect structure among the first metal interconnect structures 980 can be physically exposed at the bottom of each first pad-connection via cavity. A moat cavity can be formed through the first pad-connection-level dielectric layer 964 and the first interconnect-capping dielectric diffusion barrier layer 962 over each vertical stack of metallic ring structures (984, 986). A top surface of a metallic ring structure (984, 986) can be physically exposed at the bottom of each moat cavity.

In one embodiment, each bonding pads can have a rectangular shape or a rounded rectangular shape having sides that are parallel to a first horizontal direction hd1 and a second horizontal direction hd2. The dimension of each bonding pad along the first horizontal direction hd1 and the dimension of each bonding pad along the second horizontal direction hd2 are in a range from 2 microns to 60 microns. Each first pad-connection via cavity is formed within the area of a respective one of the topmost metal interconnect structures 980.

A pad-connection-level metallic barrier layer and a pad-connection-level metallic fill material can be sequentially deposited in the first pad-connection via cavities. The pad-connection-level metallic barrier layer includes a conductive metallic barrier material such as TiN, TaN, and/or WN. The conductive metallic barrier material can block diffusion of copper. The thickness of the pad-connection-level metallic barrier layer may be in a range from 4 nm to 80 nm, such as from 8 nm to 40 nm, although lesser and greater thicknesses can also be employed. The pad-connection-level metallic fill material can include copper, which may be deposited by a combination of a copper seed layer deposition process employing physical vapor deposition and a copper electroplating process that fills remaining volumes of the first pad-connection via cavities.

Excess portions of the pad-connection-level metallic fill material and the pad-connection-level metallic barrier layer overlying the horizontal plane including the top surface of first pad-connection-level dielectric layer 964 can be removed by a planarization process such as chemical mechanical planarization. Remaining portions of the pad-connection-level metallic fill material and the pad-connection-level metallic barrier layer that fill the first pad-connection via cavities constitute first pad-connection via structures 968. Each first pad-connection via structure 968 can include a pad-connection-level metallic barrier liner 968A and a pad-connection-level metallic fill material portion 968B. The pad-connection-level metallic barrier liner 968A is a patterned remaining portion of the pad-connection-level metallic barrier layer, and the pad-connection-level metallic fill material portion 968B is a patterned remaining portion of the pad-connection-level metallic fill material. Top surfaces of the first pad-connection via structures 968 can be within a same horizontal plane as the top surface of the first pad-connection-level dielectric layer 964.

Remaining portions of the pad-connection-level metallic fill material and the pad-connection-level metallic barrier layer that fill the moat cavities constitute first pad-connection-level ring structures 994. Each first pad-connection-level ring structures 994 can include a pad-connection-level ring liner 994A and a pad-connection-level ring fill material portion 994B. The pad-connection-level ring liner 994A is a patterned remaining portion of the pad-connection-level metallic barrier layer, and the pad-connection-level ring fill material portion 994B is a patterned remaining portion of the pad-connection-level metallic fill material. Top surfaces of the first pad-connection-level ring structures 994 can be within a same horizontal plane as the top surface of the first pad-connection-level dielectric layer 964. Each first pad-connection-level ring structures 994 can be incorporated into an underlying one of the first edge seal structures (688, 984, 986). Thus, each first edge seal structure (688, 984, 986, 994) can include a first metallic moat via structure 688, at least one first via-level ring structure 984, at least one first line-level ring structure 986, and a first pad-connection-level ring structure 994.

Figure 3A:
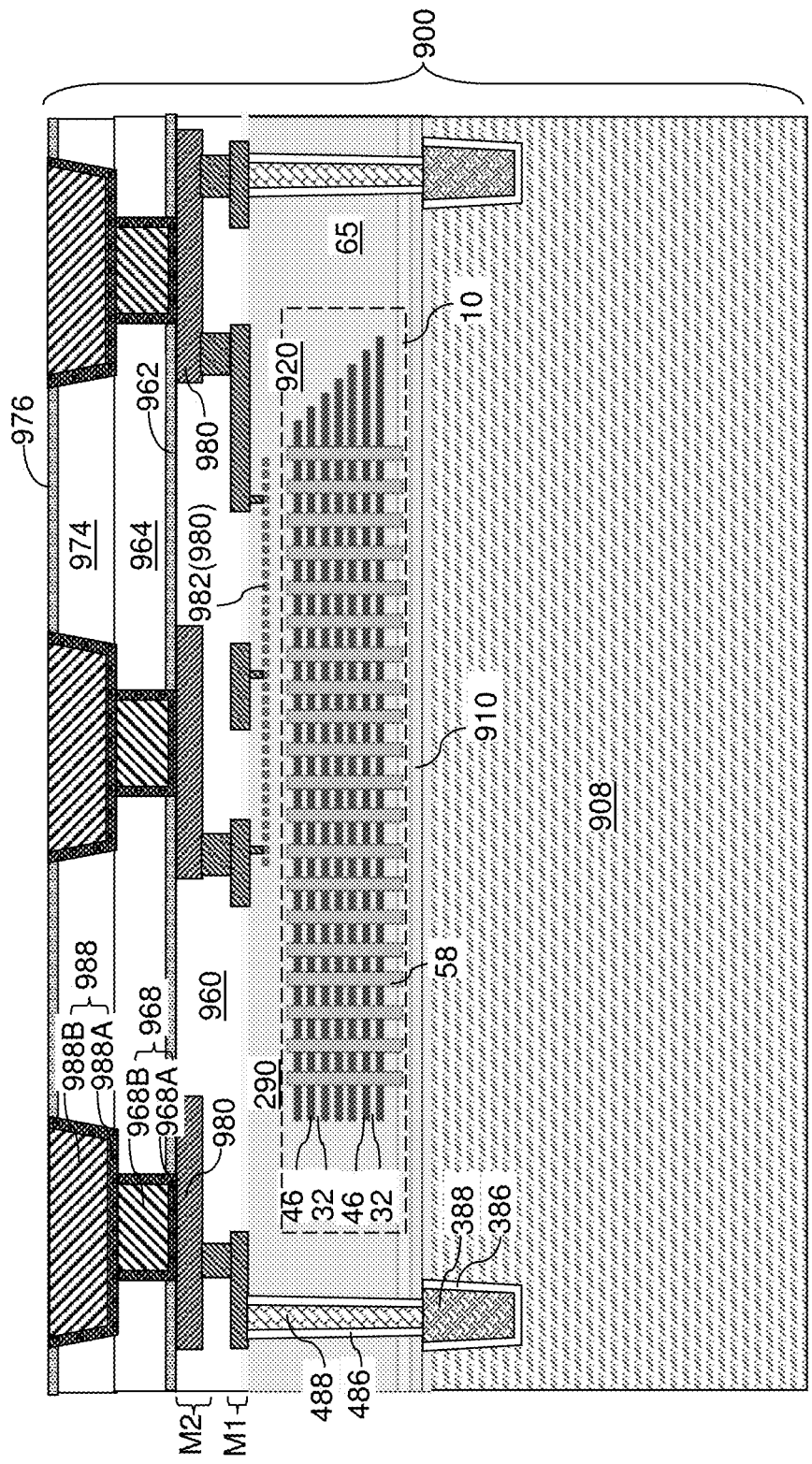
FIG. 3A a schematic vertical cross-sectional view of a device region of the first semiconductor die after formation of first bonding pads, first pad-level ring structures, and at least one row of first dummy metal pads according to an embodiment of the present disclosure.
Figure 3B:
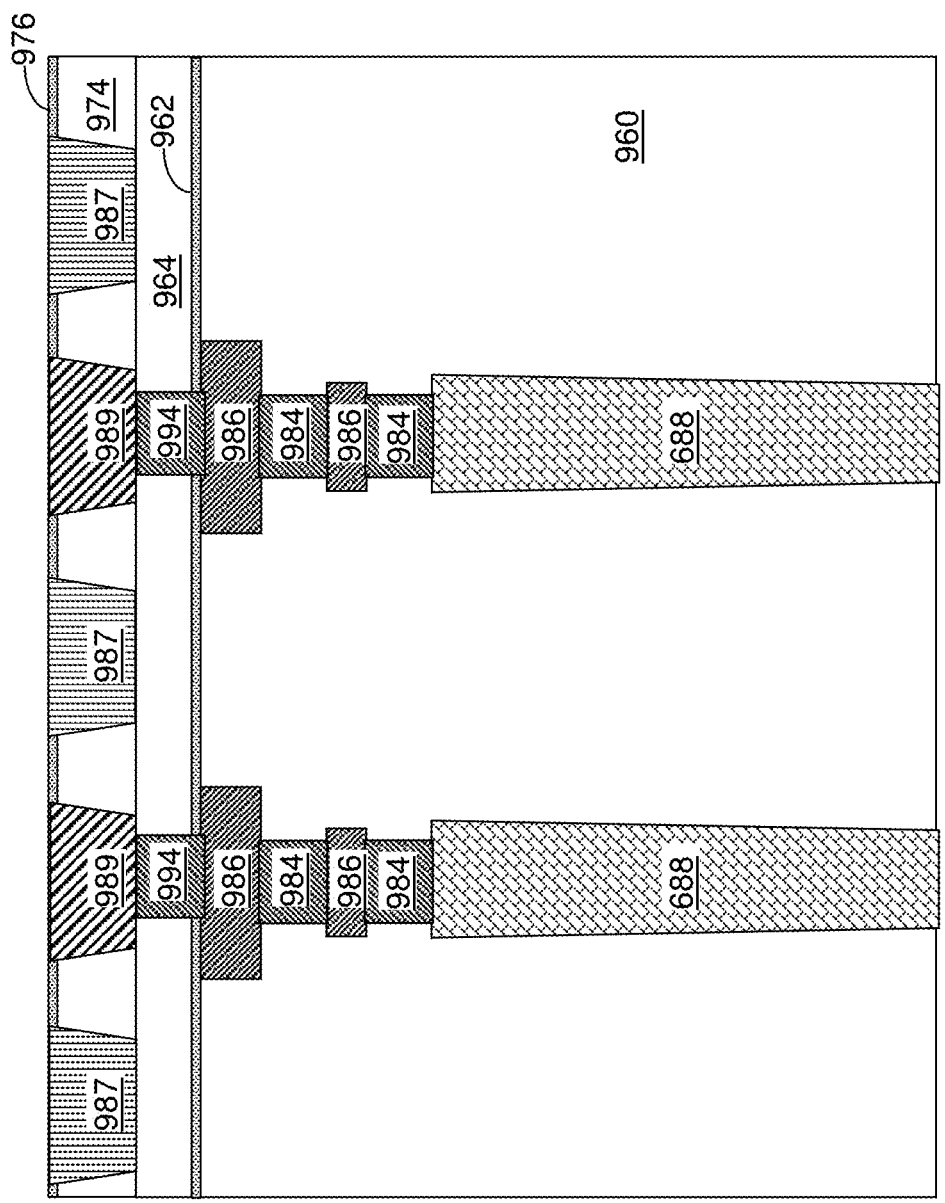
FIG. 3B is a vertical cross-sectional view of a peripheral region of the first semiconductor die of FIG. 3A.

Referring to FIGS. 3A-3C, a first pad-level dielectric layer 974 and an optional first pad-level diffusion barrier layer 976 can be formed over the first pad-connection-level dielectric layer 964. The first pad-level dielectric layer 974 may include, and/or consist essentially of, undoped silicate glass, a doped silicate glass, organosilicate glass, silicon nitride, or a dielectric metal oxide. The thickness of the first pad-level dielectric layer 974 may be in a range from 300 nm to 3,000 nm, although lesser and greater thicknesses may also be employed. The first pad-level dielectric layer 974 may have a planar top surface. The first pad-level diffusion barrier layer 976 includes a dielectric diffusion barrier material such as silicon nitride or silicon carbon nitride. The thickness of the first pad-level diffusion barrier layer 976 can be in a range from 5 nm to 50 nm, although lesser and greater thicknesses can also be employed.

A photoresist layer (not shown) can be applied over the first pad-level diffusion barrier layer 976, and can be lithographically patterned to form discrete openings in each area of the first pad-connection via structures 968. In other words, each discrete opening in the photoresist layer overlies a respective one of first pad-connection via structures 968. Each discrete opening in the photoresist layer can have a greater area than the area of an underlying first pad-connection via structure 968. Each discrete opening in the photoresist layer can have a shape of a bonding pad to be subsequently formed. For example, each discrete opening in the photoresist layer can have a rectangular shape or a rounded rectangular shape having sides that are parallel to a first horizontal direction hd1 and a second horizontal direction hd2. The dimension of each opening along the first horizontal direction hd1 and the dimension of each opening along the second horizontal direction hd2 are in a range from 2 microns to 60 microns.

Further, ring-shaped openings can be formed in the photoresist layer in areas that overlie the first pad-connection-level ring structures 994. Optionally, multiple nested ring-shaped openings can be formed through the photoresist layer. In addition, pad-shaped openings can be formed through the photoresist layer between each neighboring pair of the ring-shaped openings in the photoresist layer, and optionally inside the innermost ring-shaped opening and optionally outside the outermost ring-shaped opening. The pad-shaped openings may have about the same size as the discrete openings that are formed over the first pad-connection via structures 968 inside the first edge seal structures (688, 984, 986, 994). In one embodiment, a row of pad-shaped openings can be forms between each neighboring nested pair of ring-shaped openings. Further, a row of pad-shaped openings can be forms inside the innermost one of the first edge seal structures (688, 984, 986, 994), and a row of pad-shaped openings can be forms outside the outermost one of the first edge seal structures (688, 984, 986, 994). Each row of pad-shaped openings can be arranged along a periphery of a semiconductor die such that the first semiconductor devices 920 of the semiconductor die is laterally enclosed by each row of pad-shaped openings.

An anisotropic etch process can be performed to transfer the pattern of the openings in the photoresist layer through the first pad-level diffusion barrier layer 976 and the first pad-level dielectric layer 974. First pad cavities are formed through the first pad-level diffusion barrier layer 976 and the first pad-level dielectric layer 974 underneath discrete openings in the photoresist layer within the area enclosed by the first edge seal structures (688, 984, 986, 994). A top surfaces of a single pad-connection via structure 968 can be physically exposed at the bottom of each first pad cavity. Each first pad cavity can have a horizontal cross-sectional shape of a rectangle or a rounded rectangle such that the dimension of each first pad cavity along the first horizontal direction hd1 is in a range from 2 micron to 60 microns and the dimension of each first pad cavity along the second horizontal direction hd2 is in a range from 2 micron to 60 microns. In one embodiment, each first pad cavity can have a horizontal cross-sectional shape of a square or a rounded square such that the dimension of each first pad cavity along the first horizontal direction hd1 and the dimension of each first pad cavity along the second horizontal direction hd2 are the same. In this case, the dimension of each first pad cavity along the first horizontal direction hd1 and along the second horizontal direction hd2 can be in a range from 2 microns to 60 microns, such as from 4 microns to 30 microns. Sidewalls of the first pad cavities may be vertical, or may have a taper angle greater than 0 degree and less than 30 degrees (such as a taper angle in a range from 3 degrees to 10 degrees) with respect to the vertical direction.

Ring-shaped cavities can be formed through the first pad-level diffusion barrier layer 976 and the first pad-level dielectric layer 974 underneath each ring-shaped opening in the photoresist layer. The ring-shaped cavities can extend to a top surface of a respective one of the first pad-connection-level ring structures 994. An annular top surface of the first pad-connection-level ring structures 994 can be physically exposed at the bottom of each ring-shaped cavity. Multiple nested ring-shaped cavities can be formed through the first pad-level diffusion barrier layer 976 and the first pad-level dielectric layer 974. In addition, dummy pad-shaped cavities can be formed through the first pad-level diffusion barrier layer 976 and the first pad-level dielectric layer 974 underneath each pad-shaped opening in the photoresist layer. A row of dummy pad-shaped cavities can be formed between each neighboring pair of the ring-shaped cavities through the first pad-level diffusion barrier layer 976 and the first pad-level dielectric layer 974, and optionally inside the innermost ring-shaped cavity and optionally outside the outermost ring-shaped cavity. The dummy pad-shaped cavities may have about the same size as the discrete cavities that are formed over the first pad-connection via structures 968 inside the first edge seal structures (688, 984, 986, 994). In one embodiment, a row of dummy pad-shaped cavities can be formed between each neighboring nested pair of ring-shaped cavities. Further, a row of dummy pad-shaped cavities can be formed inside the innermost one of the first edge seal structures (688, 984, 986, 994), and a row of dummy pad-shaped cavities can be forms outside the outermost one of the first edge seal structures (688, 984, 986, 994). Each row of dummy pad-shaped cavities can be arranged along a periphery of a semiconductor die such that the first semiconductor devices 920 of the semiconductor die is laterally enclosed by each row of dummy pad-shaped cavities. The photoresist layer can be subsequently removed, for example, by ashing.

A first bonding pad liner layer and a first metallic pad fill material can be sequentially deposited in the first pad cavities, the ring-shaped cavities, and the dummy pad-shaped cavities. The first bonding pad liner layer includes a metallic nitride material such as TiN, TaN, and/or WN. The conductive metallic barrier material can block diffusion of copper. The first bonding pad liner layer is formed on top surfaces of the first pad-connection via structures 968, the top surfaces of the first pad-connection-level ring structures 994, and on the sidewalls of the first pad-level diffusion barrier layer 976 and the first pad-level dielectric layer 974 and on portion of a top surface of the pad-connection-level dielectric layer 964 around each dummy pad-shaped cavity. The thickness of the first bonding pad liner layer may be in a range from 4 nm to 80 nm, such as from 8 nm to 40 nm, although lesser and greater thicknesses can also be employed. The first metallic pad fill material can include copper, which may be deposited by a combination of a copper seed layer deposition process employing physical vapor deposition and a copper electroplating process that fills remaining volumes of the first pad cavities.

Excess portions of the first metallic pad fill material and the first bonding pad liner layer overlying the horizontal plane including the top surface of the first pad-level diffusion barrier layer 976 can be removed by a planarization process such as chemical mechanical planarization. Remaining portions of the first metallic pad fill material and the first bonding pad liner layer that fill the first pad cavities constitute first bonding pads 988. Remaining portions of the first metallic pad fill material and the first bonding pad liner layer that fill the ring-shaped cavities constitute first pad-level ring structures 989. Each remaining portions of the first metallic pad fill material and the first bonding pad liner layer that fill the dummy pad-shaped cavities constitute first dummy metal pads 987. The first dummy metal pads 987 are not connected to any first metal interconnect structure 980 or first edge seal structure (688, 984, 986, 994), and do not contact any other metal structure. As such, the first dummy metal pads 987 are electrically floating at this processing step.

Each first bonding pad 988 can include a first bonding pad liner 988A and a first metallic pad fill material portion 988B. The first bonding pad liner 988A is a patterned remaining portion of the first bonding pad liner layer, and the first metallic pad fill material portion 988B is a patterned remaining portion of the first metallic pad fill material. Top surfaces of the first bonding pads 988 can be within a same horizontal plane as the top surface of the first pad-level diffusion barrier layer 976. Each first pad-level ring structure 989 can include a pad-level ring liner (not expressly shown) and a pad-level ring fill material portion (not expressly shown). Each first dummy metal pad 987 can include a first dummy pad liner (not expressly shown) and a first dummy pad fill material portion (not expressly shown). The pad-level ring liners and the first dummy pad liners can have the same material composition and the same thickness as the first bonding pad liners 988A. The pad-level ring fill material portions and the first dummy pad fill material portions can have the same material composition and the same thickness as the first metallic pad fill material portions 988B.

Generally, the first bonding pads 988 are formed in remaining volumes of the first pad cavities directly on the top surfaces of the first pad-connection via structures 966.

Each of the first bonding pads 988 comprises, and/or consists of, a first bonding pad liner 988A comprising a metallic nitride material, and a first metallic pad fill material portion 988B embedded in the bonding pad liner 988A.

Each first pad-level ring structure 989 is formed directly on and electrically contacts a respective one of the first edge seal structures (688, 984, 986, 994), and is incorporated into the respective one of the first edge seal structures (688, 984, 986, 994). At least one first edge seal structure (688, 984, 986, 994, 989) is formed in the first semiconductor die 900. Each of the at least one first edge seal structure (688, 984, 986, 994, 989) can vertically extend from a top surface of the first substrate 908 to the topmost surface of the first pad-level dielectric layer 974, and may extend to the topmost surface of the first pad-level diffusion barrier layer 976. At least one row of first dummy metal pads 987 embedded in the first pad-level diffusion barrier layer 976 and the first pad-level dielectric layer 974 can be located between each neighboring pair of first edge seal structures (688, 984, 986, 994, 989). A row of first dummy metal pads 987 can be formed inside the innermost one of the first edge seal structures (688, 984, 986, 994, 989). Additionally or alternatively, a row of first dummy metal pads 987 can be formed outside the outermost one of the first edge seal structures (688, 984, 986, 994, 989).

Generally, the first pad-level ring structures 989, the first dummy metal pads 987, and the first bonding pads 988 can be formed by forming cavities in the first pad-level dielectric layer 974, simultaneously depositing at least one metallic material in each of the cavities, and removing excess portions of the at least one material from above the horizontal plane including the distal surface of the first pad-level dielectric layer 974. These steps form first edge seal structures (688, 984, 986, 994, 989) are formed, which laterally surround the first semiconductor devices 920 and comprise the first pad-level ring structures 989. Each of the first edge seal structures (688, 984, 986, 994, 989) vertically extends from the first substrate 908 to a horizontal plane including a distal surface of the first pad-level dielectric layer 974 and bonding surfaces of the first bonding pads 988. A row of first dummy metal pads 987 is formed between a respective pair of first edge seal structures (688, 984, 986, 994, 989).

In one embodiment, each of the first edge seal structures (688, 984, 986, 994, 989) comprises a respective one of the metallic moat via structures 688 and a respective vertical stack among the vertical stacks of metallic ring structures (984, 986, 994, 989). In one embodiment, the first edge seal structures (688, 984, 986, 994, 989) laterally surround the first semiconductor devices 920. Each of the first edge seal structures (688, 984, 986, 994, 989) vertically extends from the first substrate 908 to at least horizontal plane including a distal surface of the first pad-level dielectric layer 974 and bonding surfaces of the first bonding pads 988. Each of the first edge seal structures (688, 984, 986, 994, 989) includes a respective first pad-level ring structure 989 that continuously extends around the first semiconductor devices 920. At least one row of first dummy metal pads 987 is embedded in the first pad-level dielectric layer 974. A row of first dummy metal pads 987 is located between a pair of first edge seal structures (688, 984, 986, 994, 989).

In one embodiment, the first pad-level ring structures 989 and the first dummy metal pads 987 have a same vertical thickness and have a same material composition. In one embodiment, the first bonding pads 988 can have a same vertical thickness as the first dummy metal pads 987. In one embodiment, all sidewalls of the first dummy metal pads 987 contact the first pad-level dielectric layer 974, and all bottom surfaces of the first dummy metal pads 987 contact a respective dielectric surface, which can be a top surface of the first pad-connection-level dielectric layer 964.

In one embodiment, each of the first pad-level ring structures 989 comprises a plurality of straight laterally-extending segments that are parallel to a respective one of sidewalls of the first semiconductor die 900. For example, the straight laterally-extending segments may be parallel to the first horizontal direction hd1 or to the second horizontal direction hd2. In one embodiment, each of the first bonding pads 988 has a respective rectangular shape having sides with a respective length in a range from 2 microns to 60 microns, and each of the first pad-level ring structures 989 has a uniform width in a range from 50% of an average of lengths of sides of the rectangular shapes of the first bonding pads 988 to 200% of the average of lengths of sides of the rectangular shapes of the first bonding pads 988. In one embodiment, the first edge seal structures (688, 984, 986, 994, 989) are electrically grounded to the first substrate 908. In one embodiment, the first edge seal structures (688, 984, 986, 994, 989) are nested among one another without direct contact thereamongst.

Figure 4A:
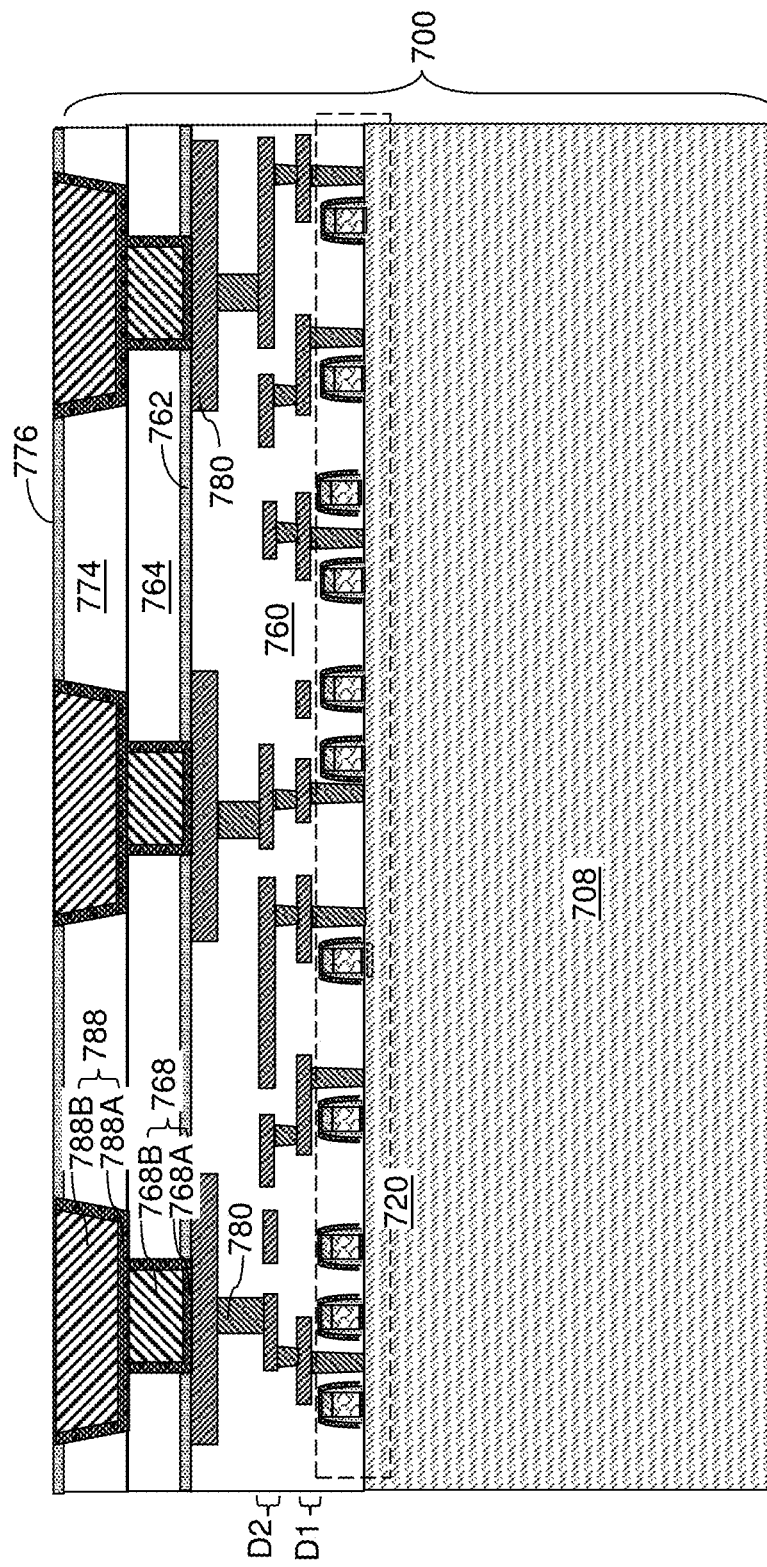
FIG. 4A a schematic vertical cross-sectional view of a device region of a second semiconductor die after formation of second bonding pads, second pad-level ring structures, and at least one row of second dummy metal pads according to an embodiment of the present disclosure.
Figure 4B:
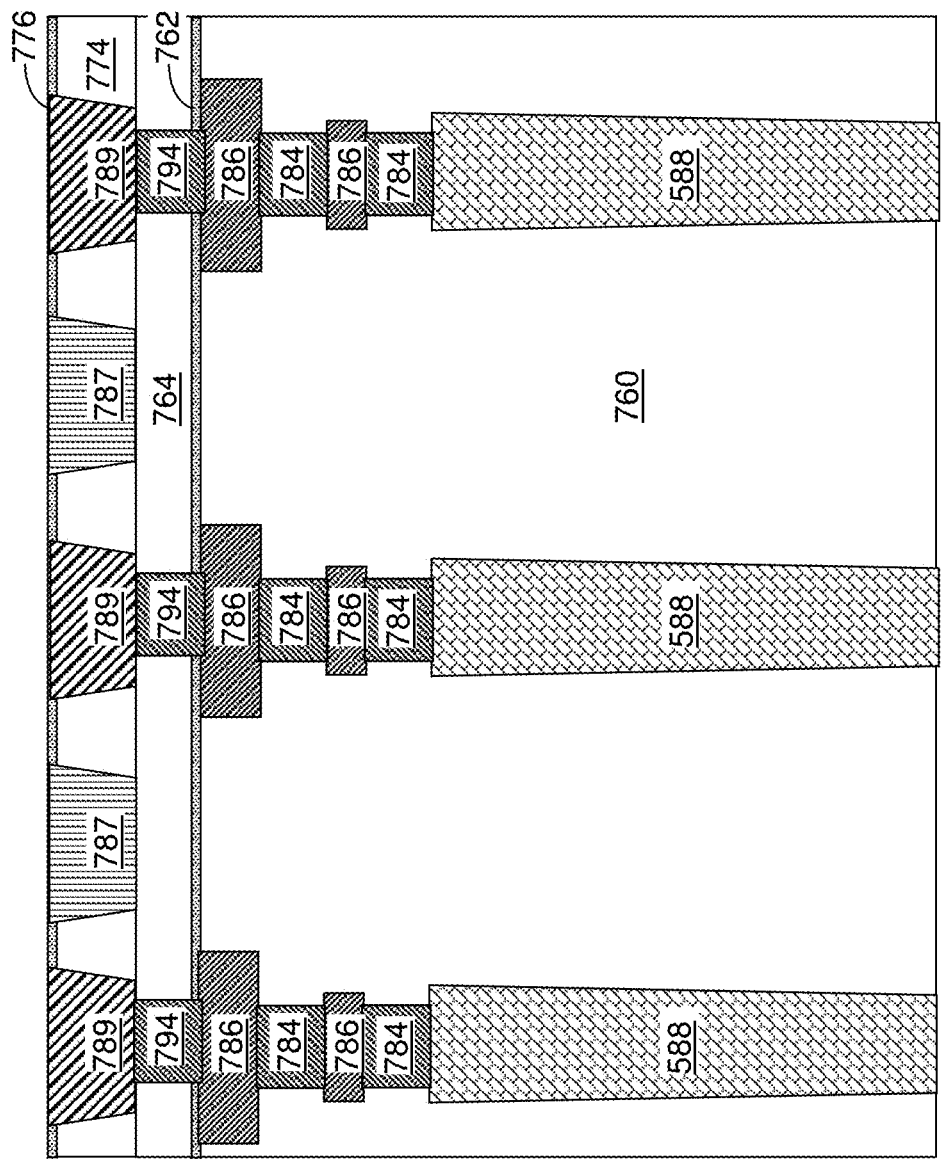
FIG. 4B is a vertical cross-sectional view of a peripheral region of the second semiconductor die of FIG. 4A.
Figure 4C:
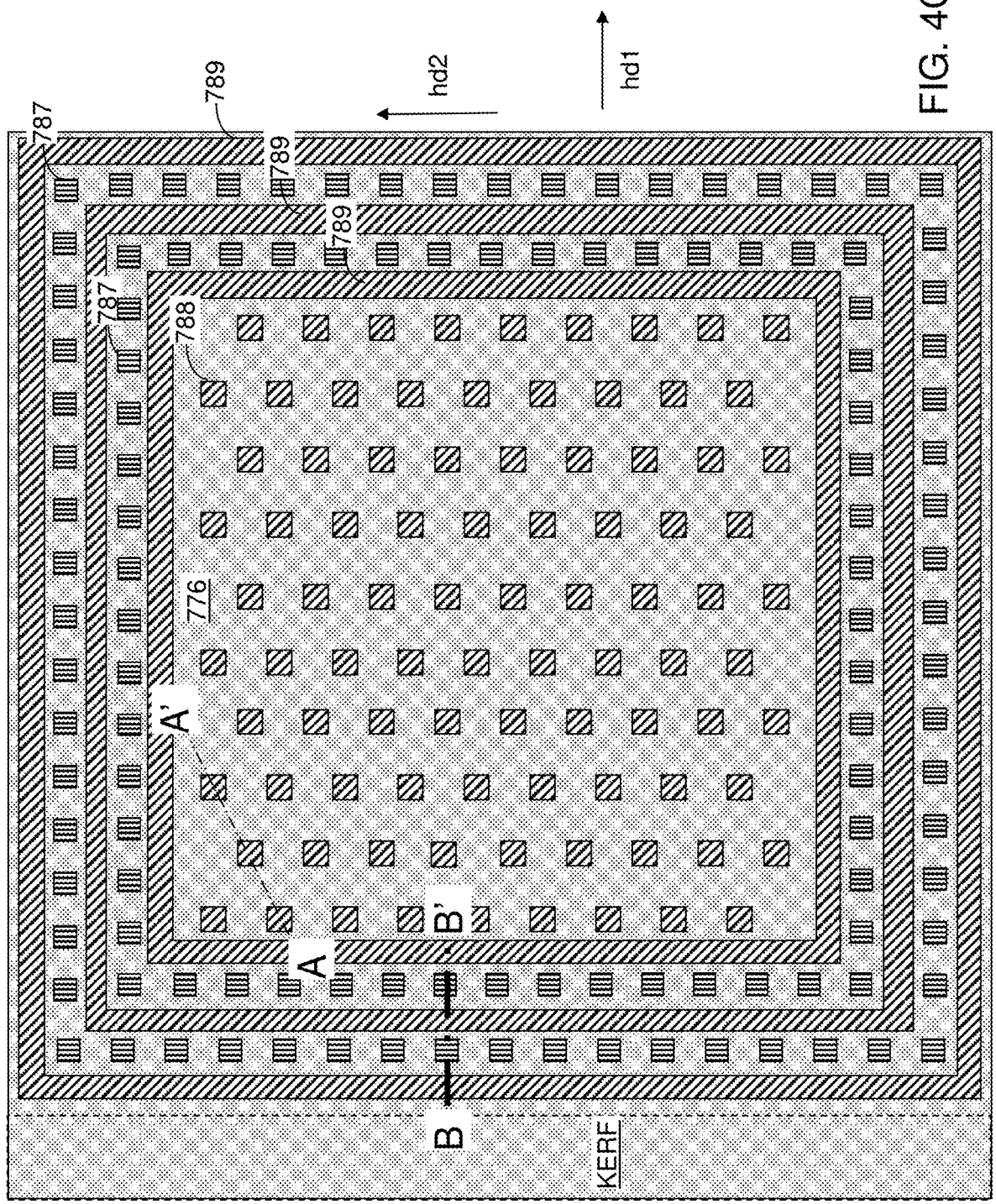
FIG. 4C is top-down view of the second semiconductor die of FIGS. 4A and 4B.

Referring to FIGS. 4A-4C, a second semiconductor die 700 according to an embodiment of the present disclosure is illustrated. The second semiconductor die 700 includes a second substrate 708, second semiconductor devices 720 overlying the second substrate 708, second interconnect-level dielectric material layers 760 overlying the second semiconductor devices 720, and second metal interconnect structures 780 embedded in the second interconnect-level dielectric material layers 760. In one embodiment, the second semiconductor devices 720 may include at least one complementary metal oxide semiconductor (CMOS) circuitry including field effect transistors. In one embodiment, the second substrate 708 may be a second substrate such as a commercially available silicon substrate having a thickness in a range from 500 microns to 1 mm.

Generally, the second semiconductor devices may comprise any semiconductor device that may be operated in conjunction with the first semiconductor devices in the first semiconductor die 900 to provide enhanced functionality. In one embodiment, the first semiconductor die 900 comprises a memory die and the second semiconductor die 700 comprises a logic die that includes a support circuitry (i.e., a peripheral circuitry) for operation of memory devices (such as a three-dimensional array of memory elements) within the memory die. In one embodiment, the first semiconductor die 900 may include a three-dimensional memory device including a three-dimensional array of memory elements, word lines (that may comprise a subset of the electrically conductive layers 46), and bit lines 982, and the second semiconductor devices 720 of the second semiconductor die 700 may include a peripheral circuitry for operation of the three-dimensional array of memory elements. The peripheral circuitry may include one or more word line driver circuits that drive the word lines of the three-dimensional array of memory elements of the first semiconductor die 900, one or more bit line driver circuits that drive the bit lines 982 of the first semiconductor die 900, one or more word line decoder circuits that decode the addresses for the word lines, one or more bit line decoder circuits that decode the addresses for the bit lines 982, one or more sense amplifier circuits that sense the states of memory elements within the memory opening fill structures 58 of the first semiconductor die 900, a source power supply circuit that provides power to the horizontal semiconductor channel layer 10 in the first semiconductor die 900, a data buffer and/or latch, and/or any other semiconductor circuit that may be used to operate three-dimensional memory device of the first semiconductor die 900.

The second interconnect-level dielectric material layers 760 may include a dielectric material such as undoped silicate glass (e.g., silicon oxide), a doped silicate glass, organosilicate glass, silicon nitride, a dielectric metal oxide, or a combination thereof. In an illustrative example, the second metal interconnect structures 780 may include a first logic-side metal level D1 including logic-side first-level metal lines, and a second logic-side metal level D2 including logic-side second-level metal lines.

The second interconnect-level dielectric material layers 760 may include one or more dielectric diffusion barrier layers (not expressly shown). In this case, each dielectric diffusion barrier layer embedded in the second interconnect-level dielectric material layers 760 may include silicon carbon nitride (SiCN), silicon nitride ($Si_3N_4$), silicon oxynitride, or any other dielectric material that is effective in blocking diffusion of copper. In one embodiment, each dielectric diffusion barrier layer embedded in the second interconnect-level dielectric material layers 760 may include a dielectric material having a dielectric constant less than 5, such as SiCN having a dielectric constant of about 3.8, to reduce RC delay of the first metal interconnect structures 980. Each dielectric diffusion barrier layer may have a thickness in a range from 10 nm to 300 nm. At least one edge seal structure (not illustrated) can be formed around the periphery of the second semiconductor die 700 through the second interconnect-level dielectric material layers 760 in the same manner as in the first semiconductor die 900. Each of the at least one edge seal structure in the second semiconductor die 700 can include a metallic moat via structure, at least one via-level ring structure and at least one line-level ring structure. Each edge seal structure in the second semiconductor die 700 includes a continuous set of conductive material portions that laterally surrounds the second semiconductor devices 720 without any opening therethrough. Each of the at least one edge seal structure in the second semiconductor die 700 vertically extends from the second substrate 708 to the top surface of the second interconnect-level dielectric material layer 780.

At least one second edge seal structure (588, 784, 786) can be formed around the periphery of the second semiconductor die 700 through the second interconnect-level dielectric material layers 760. The processing steps for forming the first edge seal structure (688, 984, 986) can be performed while making any needed modifications to form the second edge seal structures (588, 784, 786). Each second edge seal structure (588, 784, 786) can include a second metallic moat via structure 588, at least one second via-level ring structure 784, and at least one second line-level ring structure 786.

The processing steps of FIGS. 2A-2C can be performed on the second semiconductor die 700 with modifications to lithographic patterns to form a pad-connection-level structure. Specifically, a layer stack including a second interconnect-capping dielectric diffusion barrier layer 762 and a second-pad-connection-level dielectric layer 764 can be formed over the second interconnect-level dielectric material layers 760.

Second pad-connection via structure 768 and second pad-connection-level ring structures 794 can be formed through the layer stack of the second interconnect-capping dielectric diffusion barrier layer 762 and the second-pad-connection-level dielectric layer 764. Each second pad-connection via structure 768 can include a pad-connection-level metallic barrier liner 768A and a pad-connection-level metallic fill material portion 768B. Each second pad-connection via structure 768 can be formed on a respective one of topmost metal interconnect structures among the second metal interconnect structures 780.

At least one second pad-connection-level ring structure 794 can be formed on a respective second edge seal structure (588, 784, 786), and can be incorporated into the respective second edge seal structure (588, 784, 786). Thus, each second edge seal structure (588, 784, 786, 794) can include a second metallic moat via structure 588, at least one second via-level ring structure 784, at least one second line-level ring structure 786, and a second pad-connection-level ring structure 794.

Subsequently, a second pad-level dielectric layer 774 and an optional second pad-level diffusion barrier layer 776 can be formed over the second pad-connection-level dielectric layer 764. The second pad-level dielectric layer 774 may include, and/or consist essentially of, undoped silicate glass, a doped silicate glass, organosilicate glass, silicon nitride, or a dielectric metal oxide. The thickness of the second pad-level dielectric layer 774 may be in a range from 300 nm to 3,000 nm, although lesser and greater thicknesses may also be employed. The second pad-level dielectric layer 774 may have a planar top surface. The second pad-level diffusion barrier layer 776 includes a dielectric diffusion barrier material such as silicon nitride or silicon carbon nitride. The thickness of the second pad-level diffusion barrier layer 776 can be in a range from 5 nm to 50 nm, although lesser and greater thicknesses can also be employed.

A photoresist layer (not shown) can be applied over the second pad-level diffusion barrier layer 776, and can be lithographically patterned to form discrete openings in each area of the second pad-connection via structures 768. In other words, each discrete opening in the photoresist layer overlies a respective one of second pad-connection via structures 768. Each discrete opening in the photoresist layer can have a greater area than the area of an underlying second pad-connection via structure 768. Each discrete opening in the photoresist layer can have a shape of a bonding pad to be subsequently formed. For example, each discrete opening in the photoresist layer can have a rectangular shape or a rounded rectangular shape having sides that are parallel to a second horizontal direction hd1 and a second horizontal direction hd2. The dimension of each opening along the second horizontal direction hd1 and the dimension of each opening along the second horizontal direction hd2 are in a range from 2 microns to 50 microns.

Further, ring-shaped openings can be formed in the photoresist layer in areas that overlie the second pad-connection-level ring structures 794. Multiple nested ring-shaped openings can be formed through the photoresist layer. In addition, pad-shaped openings can be formed through the photoresist layer between each neighboring pair of the ring-shaped openings in the photoresist layer, and optionally inside the innermost ring-shaped opening and optionally outside the outermost ring-shaped opening. The pad-shaped openings may have about the same size as the discrete openings that are formed over the second pad-connection via structures 768 inside the second edge seal structures (588, 784, 786, 794). In one embodiment, a row of pad-shaped openings can be forms between each neighboring nested pair of ring-shaped openings. Further, a row of pad-shaped openings can be forms inside the innermost one of the second edge seal structures (588, 784, 786, 794), and a row of pad-shaped openings can be forms outside the outermost one of the second edge seal structures (588, 784, 786, 794). Each row of pad-shaped openings can be arranged along a periphery of a semiconductor die such that the second semiconductor devices 720 of the semiconductor die is laterally enclosed by each row of pad-shaped openings.

An anisotropic etch process can be performed to transfer the pattern of the openings in the photoresist layer through the second pad-level diffusion barrier layer 776 and the second pad-level dielectric layer 774. Second pad cavities are formed through the second pad-level diffusion barrier layer 776 and the second pad-level dielectric layer 774 underneath discrete openings in the photoresist layer within the area enclosed by the second edge seal structures (588, 784, 786, 794). A top surfaces of a single pad-connection via structure 768 can be physically exposed at the bottom of each second pad cavity. Each second pad cavity can have a horizontal cross-sectional shape of a rectangle or a rounded rectangle such that the dimension of each second pad cavity along the second horizontal direction hd1 is in a range from 2 micron to 50 microns and the dimension of each second pad cavity along the second horizontal direction hd2 is in a range from 2 micron to 50 microns. In one embodiment, each second pad cavity can have a horizontal cross-sectional shape of a square or a rounded square such that the dimension of each second pad cavity along the second horizontal direction hd1 and the dimension of each second pad cavity along the second horizontal direction hd2 are the same. In this case, the dimension of each second pad cavity along the second horizontal direction hd1 and along the second horizontal direction hd2 can be in a range from 2 microns to 50 microns, such as from 4 microns to 30 microns. Sidewalls of the second pad cavities may be vertical, or may have a taper angle greater than 0 degree and less than 30 degrees (such as a taper angle in a range from 3 degrees to 10 degrees) with respect to the vertical direction.

Ring-shaped cavities can be formed through the second pad-level diffusion barrier layer 776 and the second pad-level dielectric layer 774 underneath each ring-shaped opening in the photoresist layer. The ring-shaped cavities can extend to a top surface of a respective one of the second pad-connection-level ring structures 794. An annular top surface of the second pad-connection-level ring structures 794 can be physically exposed at the bottom of each ring-shaped cavity. Multiple nested ring-shaped cavities can be formed through the second pad-level diffusion barrier layer 776 and the second pad-level dielectric layer 774. In addition, dummy pad-shaped cavities can be formed through the second pad-level diffusion barrier layer 776 and the second pad-level dielectric layer 774 underneath each pad-shaped opening in the photoresist layer. A row of dummy pad-shaped cavities can be formed between each neighboring pair of the ring-shaped cavities through the second pad-level diffusion barrier layer 776 and the second pad-level dielectric layer 774, and optionally inside the innermost ring-shaped cavity and optionally outside the outermost ring-shaped cavity. The dummy pad-shaped cavities may have about the same size as the discrete cavities that are formed over the second pad-connection via structures 768 inside the second edge seal structures (588, 784, 786, 794). In one embodiment, a row of dummy pad-shaped cavities can be formed between each neighboring nested pair of ring-shaped cavities. Further, a row of dummy pad-shaped cavities can be formed inside the innermost one of the second edge seal structures (588, 784, 786, 794), and a row of dummy pad-shaped cavities can be forms outside the outermost one of the second edge seal structures (588, 784, 786, 794). Each row of dummy pad-shaped cavities can be arranged along a periphery of a semiconductor die such that the second semiconductor devices 720 of the semiconductor die is laterally enclosed by each row of dummy pad-shaped cavities. The photoresist layer can be subsequently removed, for example, by ashing.

A second bonding pad liner layer and a second metallic pad fill material can be sequentially deposited in the second pad cavities, the ring-shaped cavities, and the dummy pad-shaped cavities. The second bonding pad liner layer includes a metallic nitride material such as TiN, TaN, and/or WN. The conductive metallic barrier material can block diffusion of copper. The second bonding pad liner layer is formed on top surfaces of the second pad-connection via structures 768, the top surfaces of the second pad-connection-level ring structures 794, and on the sidewalls of the second pad-level diffusion barrier layer 776 and the second pad-level dielectric layer 774 and on portion of a top surface of the second pad-connection-level dielectric layer 764 around each dummy pad-shaped cavity. The thickness of the second bonding pad liner layer may be in a range from 4 nm to 80 nm, such as from 8 nm to 40 nm, although lesser and greater thicknesses can also be employed. The second metallic pad fill material can include copper, which may be deposited by a combination of a copper seed layer deposition process employing physical vapor deposition and a copper electroplating process that fills remaining volumes of the second pad cavities.

Excess portions of the second metallic pad fill material and the second bonding pad liner layer overlying the horizontal plane including the top surface of the second pad-level diffusion barrier layer 776 can be removed by a planarization process such as chemical mechanical planarization. Remaining portions of the second metallic pad fill material and the second bonding pad liner layer that fill the second pad cavities constitute second bonding pads 788. Remaining portions of the second metallic pad fill material and the second bonding pad liner layer that fill the ring-shaped cavities constitute second pad-level ring structures 789. Each remaining portions of the second metallic pad fill material and the second bonding pad liner layer that fill the pad cavities constitute second dummy metal pads 787. The second dummy metal pads 787 are not connected to any second metal interconnect structure 780 or the second edge seal structure (588, 784, 786, 794), and do not contact any other metal structure. As such, the second dummy metal pads 787 are electrically floating at this processing step.

Each second bonding pad 788 can include a second bonding pad liner 788A and a second metallic pad fill material portion 788B. The second bonding pad liner 788A is a patterned remaining portion of the second bonding pad liner layer, and the second metallic pad fill material portion 788B is a patterned remaining portion of the second metallic pad fill material. Top surfaces of the second bonding pads 788 can be within a same horizontal plane as the top surface of the second pad-level diffusion barrier layer 776. Each second pad-level ring structure 789 can include a pad-level ring liner (not expressly shown) and a pad-level ring fill material portion (not expressly shown). Each second dummy metal pad 787 can include a second dummy pad liner (not expressly shown) and a second dummy pad fill material portion (not expressly shown). The pad-level ring liners and the second dummy pad liners can have the same material composition and the same thickness as the second bonding pad liners 788A. The pad-level ring fill material portions and the second dummy pad fill material portions can have the same material composition and the same thickness as the second metallic pad fill material portions 788B.

Generally, the second bonding pads 788 are formed in remaining volumes of the second pad cavities directly on the top surfaces of the second pad-connection via structures 766. Each of the second bonding pads 788 comprises, and/or consists of, a second bonding pad liner 788A comprising a metallic nitride material, and a second metallic pad fill material portion 788B embedded in the second bonding pad liner 788A.

Each second pad-level ring structure 789 is formed directly on and in electrical contact with a respective one of the second edge seal structures (588, 784, 786, 794), and is incorporated into the respective one of the second edge seal structures (588, 784, 786, 794). At least one second edge seal structure (588, 784, 786, 794, 789) is formed in the second semiconductor die 700. Each of the at least one second edge seal structure (588, 784, 786, 794, 789) can vertically extend from a top surface of the second substrate 708 at least to the topmost surface of the second pad-level dielectric layer 774, and may extend to the topmost surface of the second pad-level diffusion barrier layer 776. At least one row of second dummy metal pads 787 embedded in the second pad-level diffusion barrier layer 776 and the second pad-level dielectric layer 774 can be located between each neighboring pair of second edge seal structures (588, 784, 786, 794, 789). A row of second dummy metal pads 787 can be formed inside the innermost one of the second edge seal structures (588, 784, 786, 794, 789). Additionally or alternatively, a row of second dummy metal pads 787 can be formed outside the outermost one of the second edge seal structures (588, 784, 786, 794, 789).

Generally, the second pad-level ring structures 789, the second dummy metal pads 787, and the second bonding pads 788 can be formed by forming cavities in the second pad-level dielectric layer 774, simultaneously depositing at least one metallic material in each of the cavities, and removing excess portions of the at least one material from above the horizontal plane including the distal surface of the second pad-level dielectric layer 774. These steps form second edge seal structures (588, 784, 786, 794, 789), which laterally surround the second semiconductor devices 720 and comprise the second pad-level ring structures 789. Each of the second edge seal structures (588, 784, 786, 794, 789) vertically extends from the second substrate 708 to a horizontal plane including a distal surface of the second pad-level dielectric layer 774 and bonding surfaces of the second bonding pads 788. A row of second dummy metal pads 787 is formed between a respective pair of second edge seal structures (588, 784, 786, 794, 789).

In one embodiment, each of the second edge seal structures (588, 784, 786, 794, 789) comprises a respective one of the metallic moat via structures 588 and a respective vertical stack among the vertical stacks of metallic ring structures (784, 786, 794, 789). In one embodiment, the second edge seal structures (588, 784, 786, 794, 789) laterally surround the second semiconductor devices 720. Each of the second edge seal structures (588, 784, 786, 794, 789) vertically extends from the second substrate 708 at least to a horizontal plane including a distal surface of the second pad-level dielectric layer 774 and bonding surfaces of the second bonding pads 788. Each of the second edge seal structures (588, 784, 786, 794, 789) includes a respective second pad-level ring structure 789 that continuously extends around the second semiconductor devices 720. At least one row of second dummy metal pads 787 is embedded in the second pad-level dielectric layer 774. A row of second dummy metal pads 787 is located between a pair of second edge seal structures (588, 784, 786, 794, 789).

In one embodiment, the second pad-level ring structures 789 and the second dummy metal pads 787 have a same vertical thickness and have a same material composition. In one embodiment, the second bonding pads 788 can have a same vertical thickness as the second dummy metal pads 787. In one embodiment, all sidewalls of the second dummy metal pads 787 contact the second pad-level dielectric layer 774, and all bottom surfaces of the second dummy metal pads 787 contact a respective dielectric surface, which can be a top surface of the second pad-connection-level dielectric layer 764.

In one embodiment, each of the second pad-level ring structures 789 comprises a plurality of straight laterally-extending segments that are parallel to a respective one of sidewalls of the second semiconductor die 700. For example, the straight laterally-extending segments may be parallel to the second horizontal direction hd1 or to the second horizontal direction hd2. In one embodiment, each of the second bonding pads 788 has a respective rectangular shape having sides with a respective length in a range from 2 microns to 50 microns, and each of the second pad-level ring structures 789 has a uniform width in a range from 50% of an average of lengths of sides of the rectangular shapes of the second bonding pads 788 to 200% of the average of lengths of sides of the rectangular shapes of the second bonding pads 788. In one embodiment, the second edge seal structures (588, 784, 786, 794, 789) are electrically grounded to the second substrate 708. In one embodiment, the second edge seal structures (588, 784, 786, 794, 789) are nested among one another without direct contact thereamongst.

The second bonding pads 788 can be arranged in a mirror image pattern of the pattern of the first bonding pads 988. Each second pad-level ring structures 789 cam be formed within a respective area that corresponds to the mirror image area of a respective row of first dummy metal pads 987. Each row of second dummy metal pads 787 can be formed within a respective area that corresponds to the mirror image area of a respective first pad-level ring structure 989.

Figure 5:
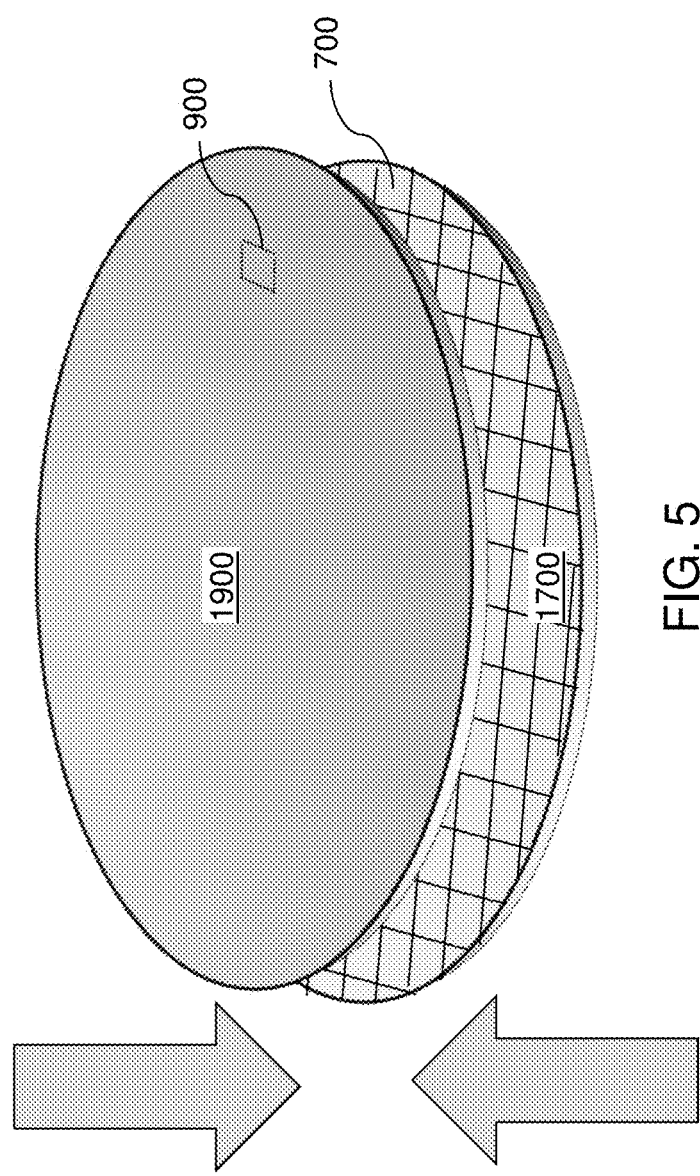
FIG. 5 is a perspective view illustrating alignment of a first wafer including multiple instances of the first semiconductor die and a second wafer including multiple instances of the second semiconductor die according to an embodiment of the present disclosure.
Figure 6A:
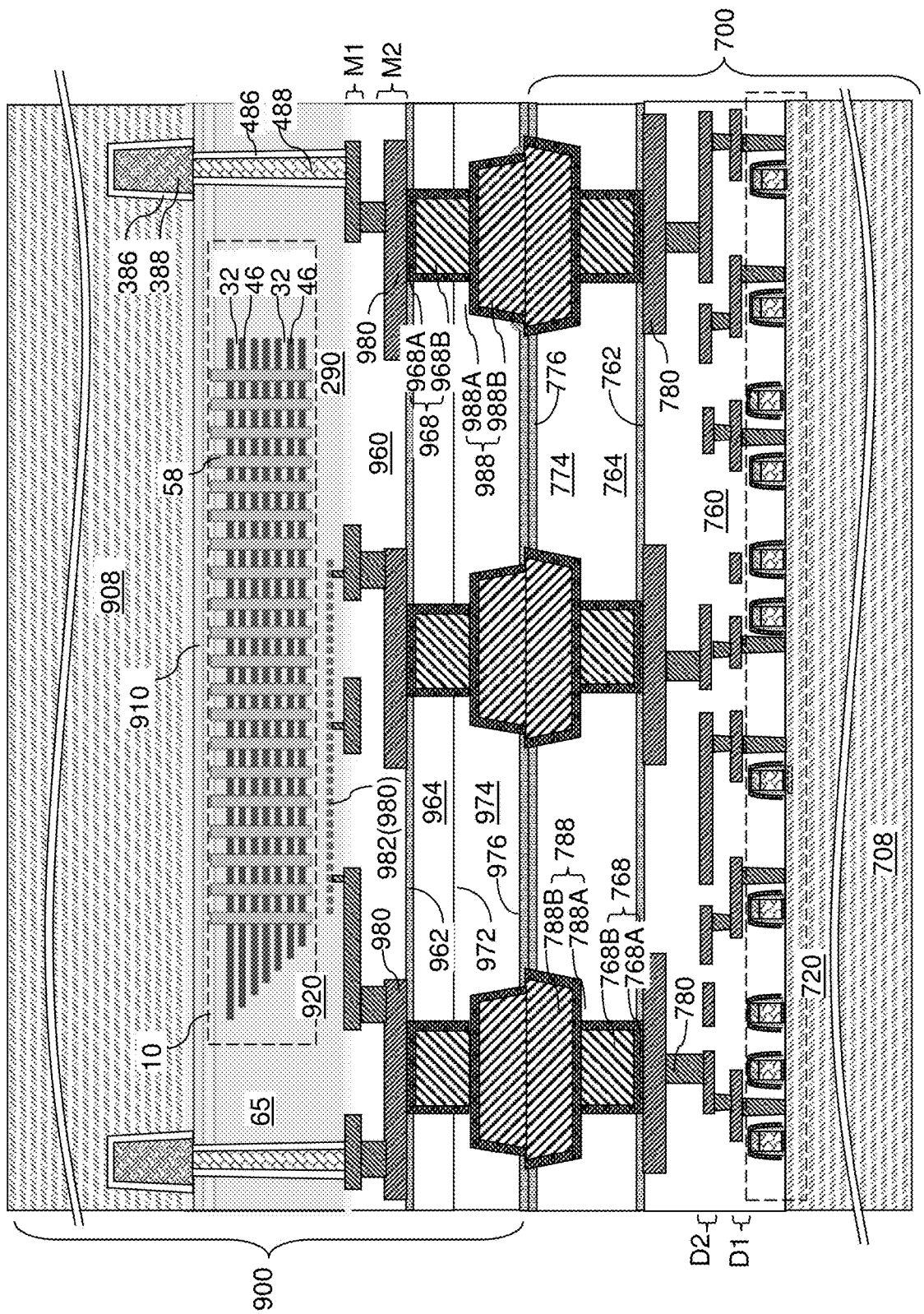
FIG. 6A is a vertical cross-sectional view of a bonded assembly of the first semiconductor die and the second semiconductor die according to an embodiment of the present disclosure.
Figure 6B:
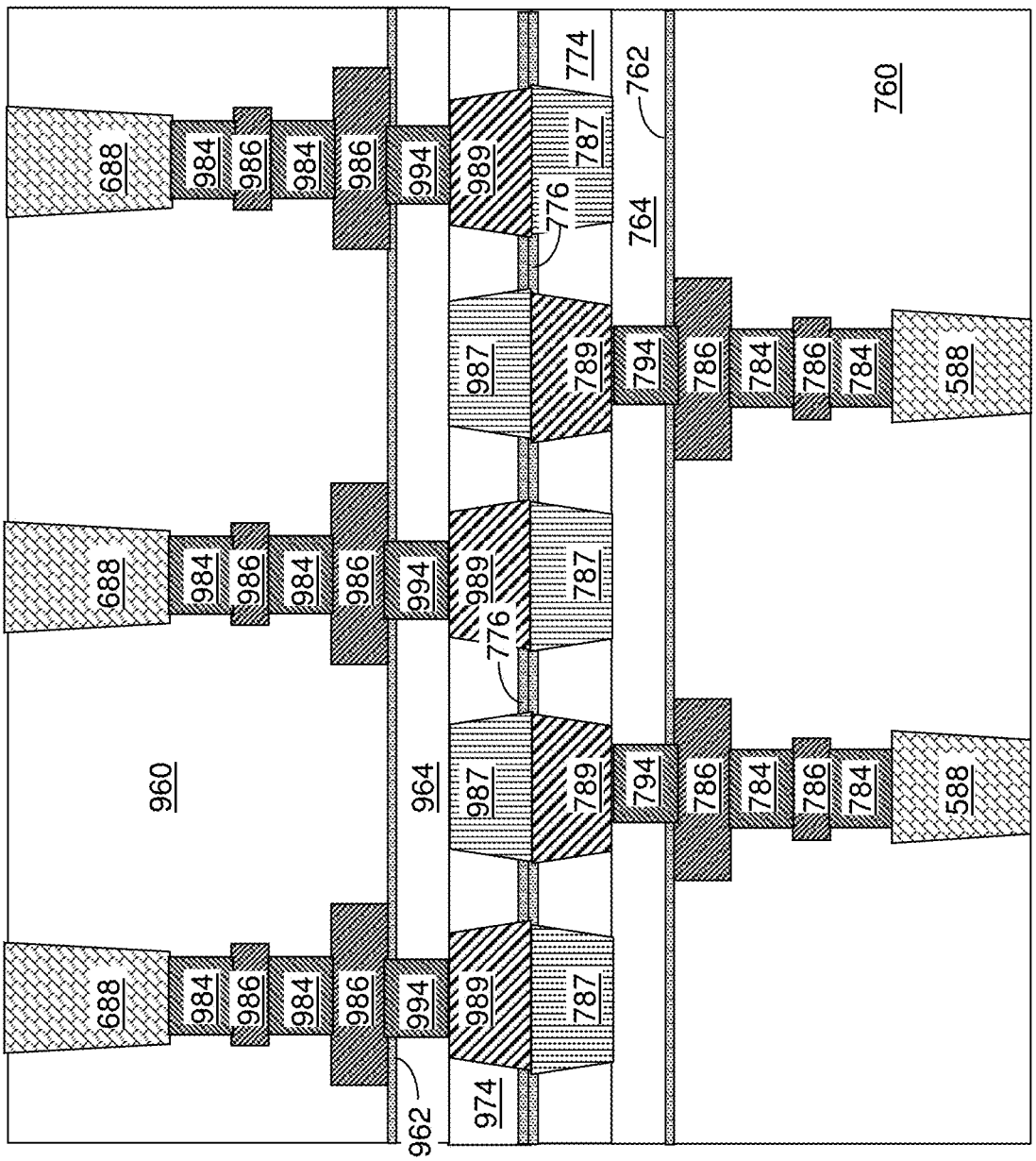
FIG. 6B is a vertical cross-sectional view of a peripheral region of the bonded assembly of FIG. 6A.
Figure 6C:
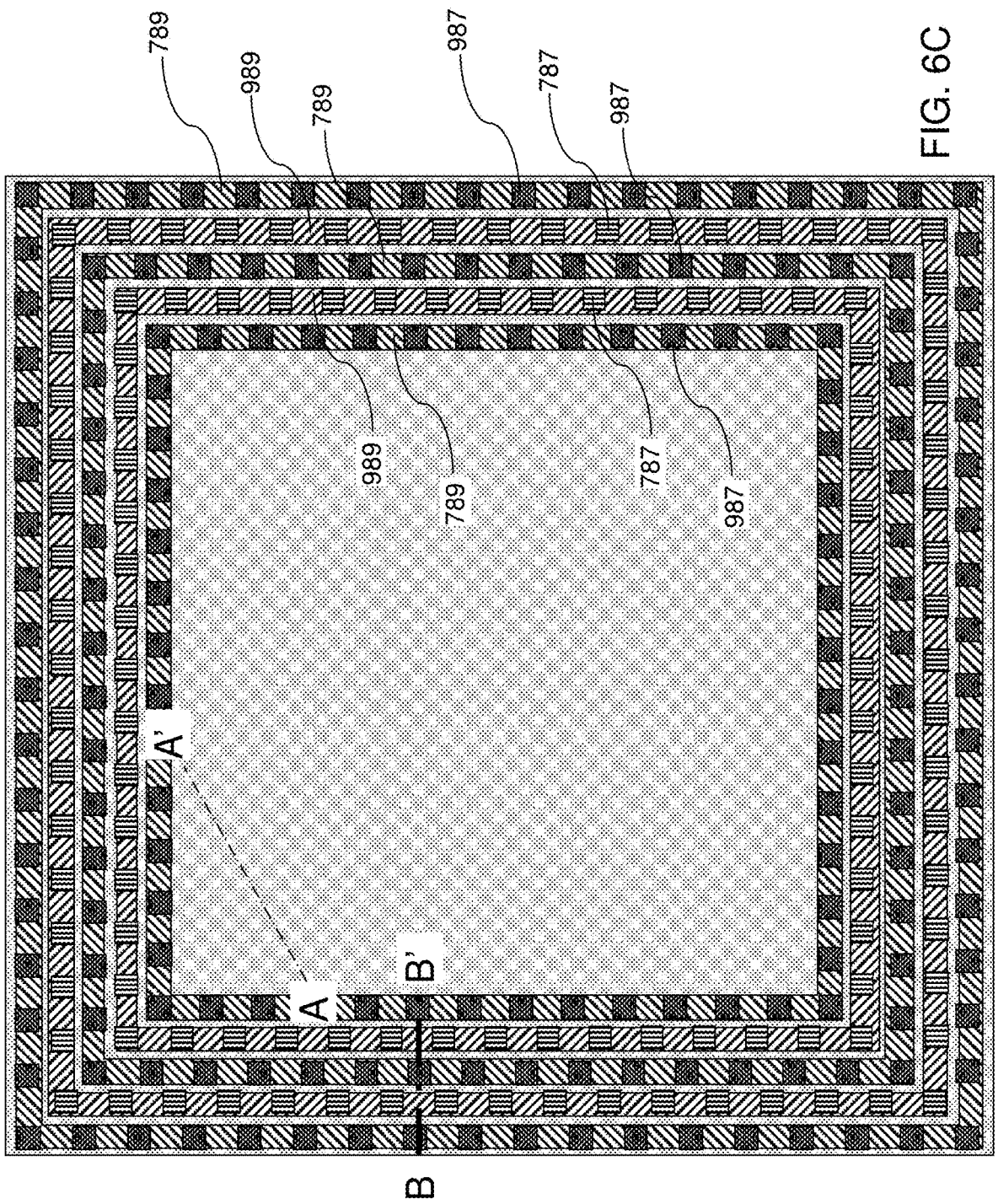
FIG. 6C is a plan view of the bonded assembly of FIGS. 6A and 6B at a bonding interface.
Figure 6D:
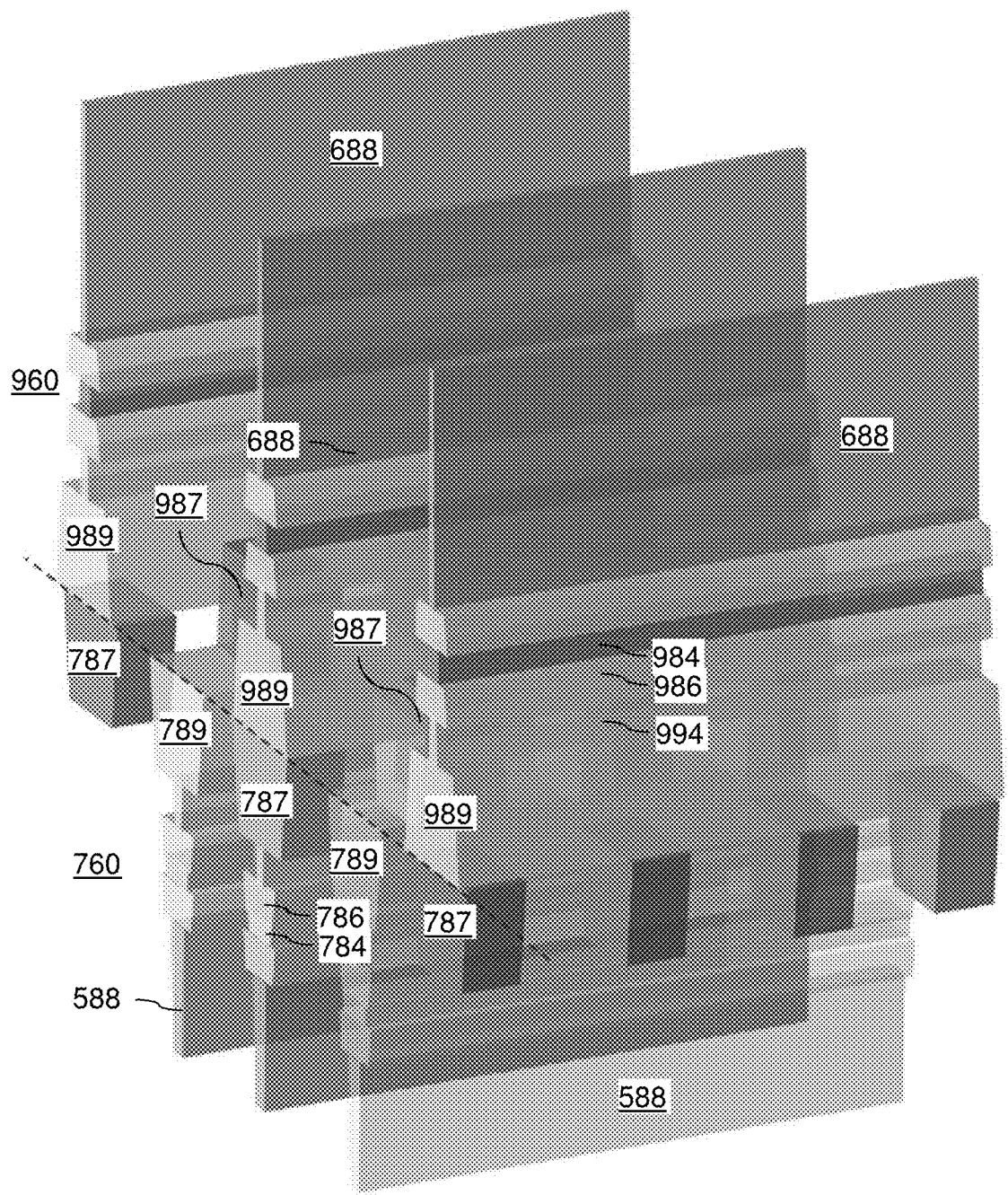
FIG. 6D is a see-through perspective view of the peripheral region of the bonded assembly of FIGS. 6A-6C.
Figure 6E:
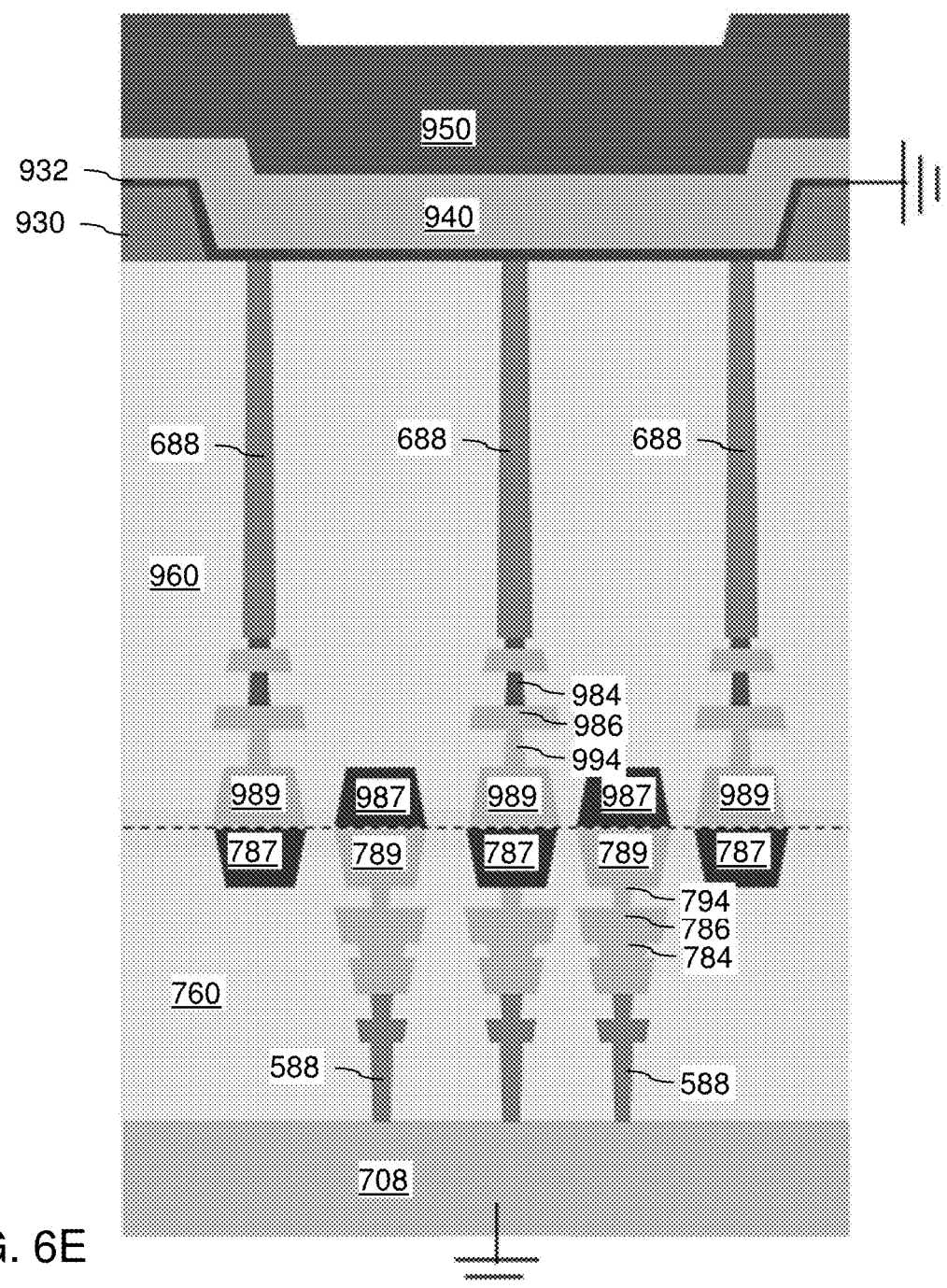
FIG. 6E is another vertical cross-sectional view of the peripheral region of the bonded assembly of FIGS. 6A-6D.

Referring to FIG. 5, a first wafer 1900 including a plurality of the first semiconductor dies 900 and a second wafer 1700 including a plurality of second semiconductor dies 700 can be aligned to each other for bonding. Each second bonding pad 788 faces a respective one of the first bonding pads 988. Each facing pair of a first bonding pad 988 and a second bonding pad 788 can be aligned to maximize the areal overlap between the first bonding pads 988 and the second bonding pads 788. If the first bonding pads 988 and the second bonding pads 788 have different areas, each overlap area between a facing pair of a first bonding pad 988 and a second bonding pad 788 can be the same as the area of the smaller bonding pad between the facing pair of the first bonding pad 988 and the second bonding pad 788. If the first bonding pads 988 and the second bonding pads 788 have the same area, the overlap area between a facing pair of a first bonding pad 988 and a second bonding pad 788 can be in a range from 90% to 100%, such as from 95% to 100%, of the area of the first bonding pad 988 (which is the same as the area of the second bonding pad 788).

Further, each facing pair of a first semiconductor die 900 and a second semiconductor die 700 can be aligned such that each second pad-level ring structures 789 faces a respective row of first dummy metal pads 987, and each row of second dummy metal pads 787 faces a respective first pad-level ring structure 989.

Referring to FIGS. 6A-6E, each facing pair of a first semiconductor die 900 and a second semiconductor die 700 can be brought into contact each other so that each first bonding pad 988 contacts a respective one of the second bonding pads 788 with a respective areal overlap therebetween. The assembly of the first semiconductor die 900 and the second semiconductor die 700 are annealed at an elevated temperature in a range from 250 degrees Celsius to 400 degrees Celsius to induce copper diffusion across each interface between facing pairs of a respective first bonding pad 988 and a respective second bonding pad 788. The duration of the anneal process at the elevated temperature can be in a range from 5 minutes to 2 hours, although shorter or longer anneal duration may also be employed. Each facing pair of a first bonding pad 988 and a second bonding pad 788 is bonded to each other during the anneal process at the elevated temperature. A first exemplary bonded structure including the first semiconductor die 900 and the second semiconductor die 700 can be formed.

According to an aspect of the present disclosure, each row of first dummy metal pads 987 is bonded to a respective one of the second edge seal structures (588, 784, 786, 794, 789). For example, each row of first dummy metal pads 987 can be bonded to second pad-level ring structure 789. Each first edge seal structure (688, 984, 986, 994, 989) can be bonded to a respective row of second dummy metal pads 787. For example, each first pad-level ring structure 989 can be bonded to a respective second metal pad 787. Each first pad-level ring structure 989 can contact a horizontal surface of the second pad-level dielectric layer 974. Each second pad-level ring structure 789 can contact a horizontal surface of the first pad-level dielectric layer 974.

The first edge seal structure (688, 984, 986, 994, 989) can be electrically connected to (i.e., electrically shorted to) the first substrate 908. The second edge seal structures (588, 784, 786, 794, 789) can be electrically connected to the second substrate 708. In an alternative embodiment illustrated in FIG. 6E, the first substrate 908 may be replaced with a combination of a first backside dielectric layer 930, a conductive material layer 932, a second backside dielectric layer 940, and a third backside dielectric layer 950. In this case, the first edge seal structures (688, 984, 986, 994, 989) can be electrically connected to the conductive material layer 932. In an illustrative example, the first backside dielectric layer 930 can include silicon oxide, the conductive material layer 932 can include a heavily doped semiconductor material or a metallic material (such as TiN, TaN, WN, W, Mo, Ru, Co, and/or combinations thereof), the second backside dielectric layer 940 can include a combination of silicon oxide and silicon nitride, and the third backside dielectric layer 950 can include polyimide (PI).

Figure 7:
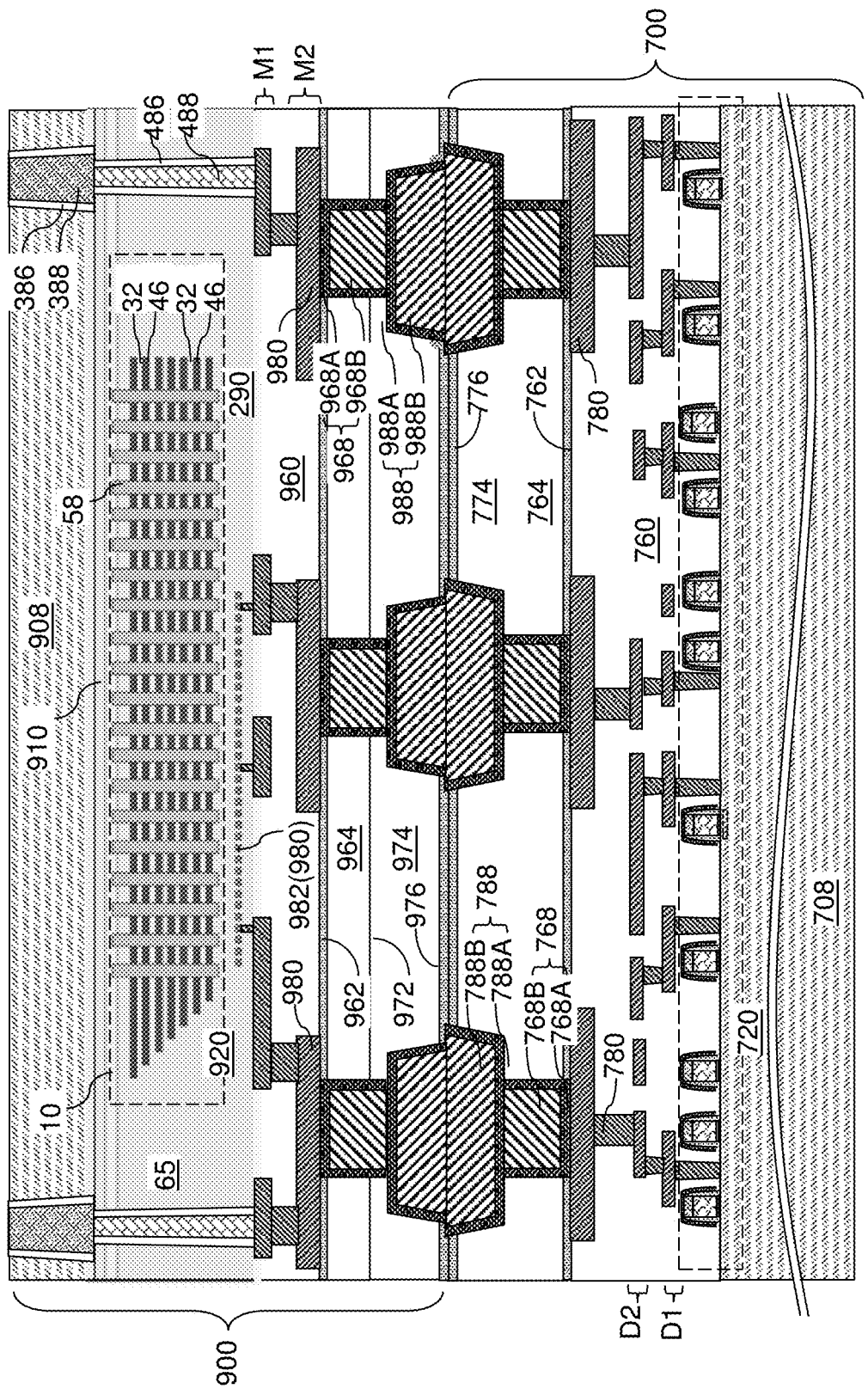
FIG. 7 is a vertical cross-sectional view of the bonded assembly after thinning the backside of the first semiconductor die according to an embodiment of the present disclosure.

Referring to FIG. 7, the first substrate 908 may be thinned from the backside by grinding, polishing, an anisotropic etch, or an isotropic etch. The thinning process can continue until horizontal portions of the through-substrate liners 386 are removed, and horizontal surfaces of the through-substrate via structures 388 are physically exposed. Generally, end surfaces of the through-substrate via structures 388 can be physically exposed by thinning the backside of the first substrate 908, which may be the substrate of a memory die. The thickness of the first substrate 908 after thinning may be in a range from 1 micron to 30 microns, such as from 2 microns to 15 microns, although lesser and greater thicknesses can also be employed.

Figure 8:
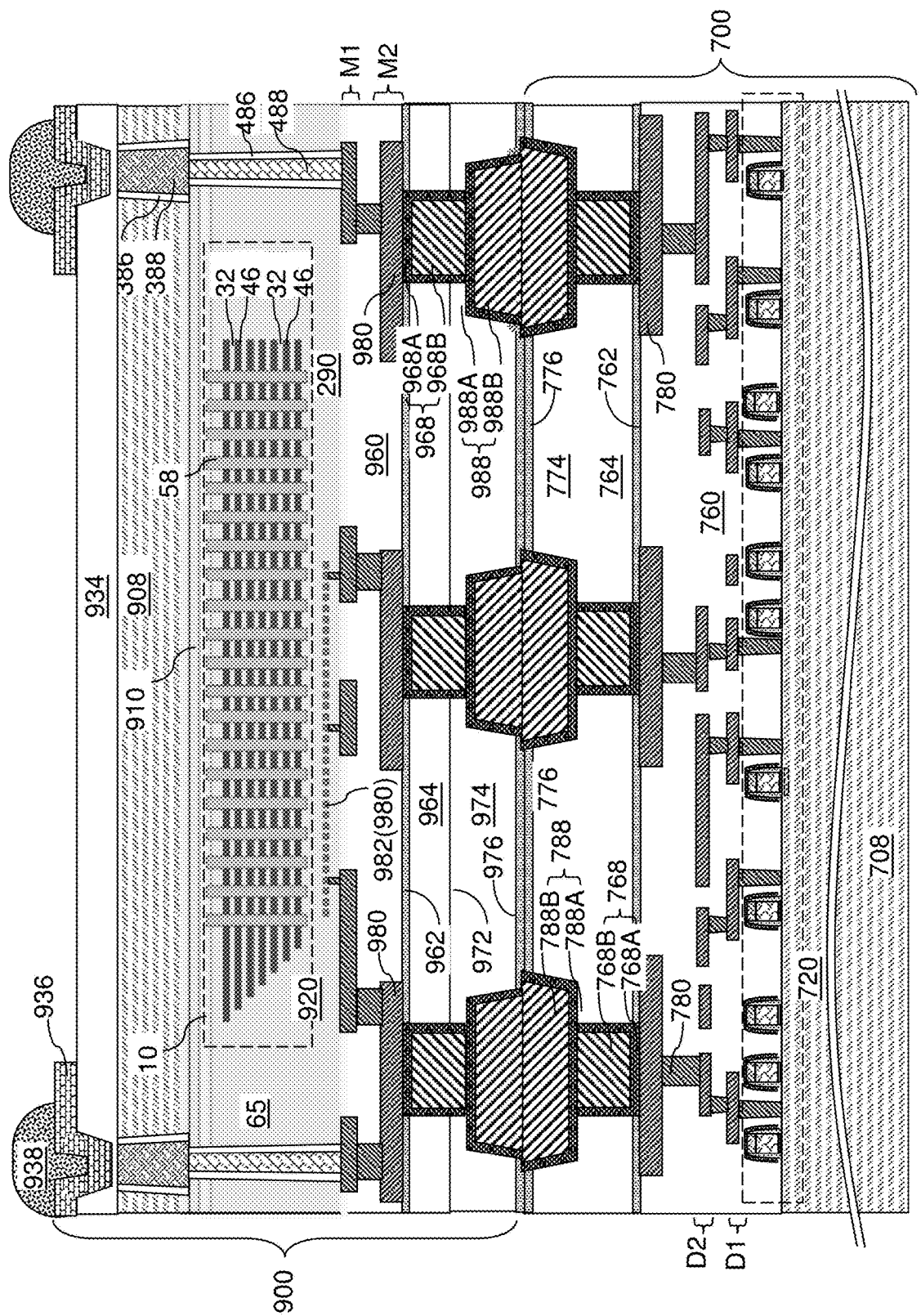
FIG. 8 is a vertical cross-sectional view of the bonded assembly after formation of a backside dielectric layer, external bonding pads, and solder balls according to an embodiment of the present disclosure.

Referring to FIG. 8, a backside insulating layer 934 may be formed on the backside of the first substrate 908. The backside insulating layer 934 includes an insulating material such as silicon oxide. The thickness of the backside insulating layer 934 can be in a range from 50 nm to 500 nm, although lesser and greater thicknesses can also be employed. A photoresist layer (not shown) may be applied over the backside insulating layer 934, and may be lithographically patterned to form opening over areas of the through-substrate via structures 388. An etch process can be performed to form via cavities through the backside insulating layer 934 underneath each opening in the photoresist layer. A top surface of a through-substrate via structure 388 can be physically exposed at the bottom of each via cavity through the backside insulating layer 934.

At least one metallic material can be deposited into the openings through the backside insulating layer 934 and over the planar surface of the backside insulating layer 934 to form a metallic material layer. The at least one metallic material can include copper, aluminum, ruthenium, cobalt, molybdenum, and/or any other metallic material that may be deposited by physical vapor deposition, chemical vapor deposition, electroplating, vacuum evaporation, or other deposition methods. For example, a metallic nitride liner material (such as TiN, TaN, or WN) may be deposited directly on the physically exposed surfaces of the through-substrate via structures 388, on sidewalls of the openings through the backside insulating layer 934, and over the physically exposed planar surface of the backside insulating layer 934. The thickness of the metallic nitride liner material can be in a range from 10 nm to 100 nm, although lesser and greater thicknesses can also be employed. At least one metallic fill material such as copper or aluminum can be deposited over the metallic nitride liner material. In one embodiment, the at least one metallic fill material can include a stack of a high-electrical-conductivity metal layer (such as a copper layer or an aluminum layer) and an underbump metallurgy (UBM) layer stack for bonding a solder ball thereupon. Exemplary UBM layer stacks include, but are not limited to, an Al/Ni/Au stack, an Al/Ni/Cu stack, a Cu/Ni/Au stack, a Cu/Ni/Pd stack, a Ti/Ni/Au stack, a Ti/Cu/Ni/Au stack, a Ti—W/Cu stack, a Cr/Cu stack, and a Cr/Cu/Ni stack. The thickness of the metallic material layer over the planar horizontal surface of the backside insulating layer 934 can be in a range from 0.5 microns to 10 microns, such as from 1 micron to 5 microns, although lesser and greater thicknesses can also be employed.

The at least one metallic fill material and the metallic material layer can be subsequently patterned to form discrete backside bonding pads 936 contacting a respective one of the through-substrate via structures 388. The backside bonding pads 936 can function as external bonding pads that can be employed to electrically connect various nodes of within the first semiconductor die 900 and the second semiconductor die 700 to external nodes, such as bonding pads on a packaging substrate or C4 bonding pads of another semiconductor die. For example, solder material portions 938 can be formed on the backside bonding pads 936, and a C4 bonding process or a wire bonding process can be performed to electrically connect the backside bonding pads 936 to external electrically active nodes.

Generally, backside bonding pads 936 can be formed on a backside surface of the first semiconductor die 900 (which may be a memory die) that is located on an opposite side of the bonding interface between the first bonding pads 988 and the second bonding pads 788. Through-substrate via structures 388 can vertically extend through the first semiconductor die 900, and can provide electrical connection between the backside bonding pads 936 and a subset of the bonding pads (988, 788).

FIGS. 9A-9J illustrate alternative configurations of the peripheral region of the bonded assembly according to various embodiments of the present disclosure. The various arrows in FIGS. 9A-9J indicate portions of the first pad-level diffusion barrier layer 976 and the second pad-level diffusion barrier layer 776 that block moisture or contaminants from entering from outside a bonded assembly of a first semiconductor die 900 and a second semiconductor die 700 into regions containing the first semiconductor devices 920 or the second semiconductor devices 720. The various configurations of the bonded assembly reduce the ingress of moisture and contaminants by employing dummy metal pads (987, 787) which increases the diffusion paths for moisture and contaminants. The various configurations of the bonded assembly also reduce the noise effect for high frequency operation.

Figure 9A:
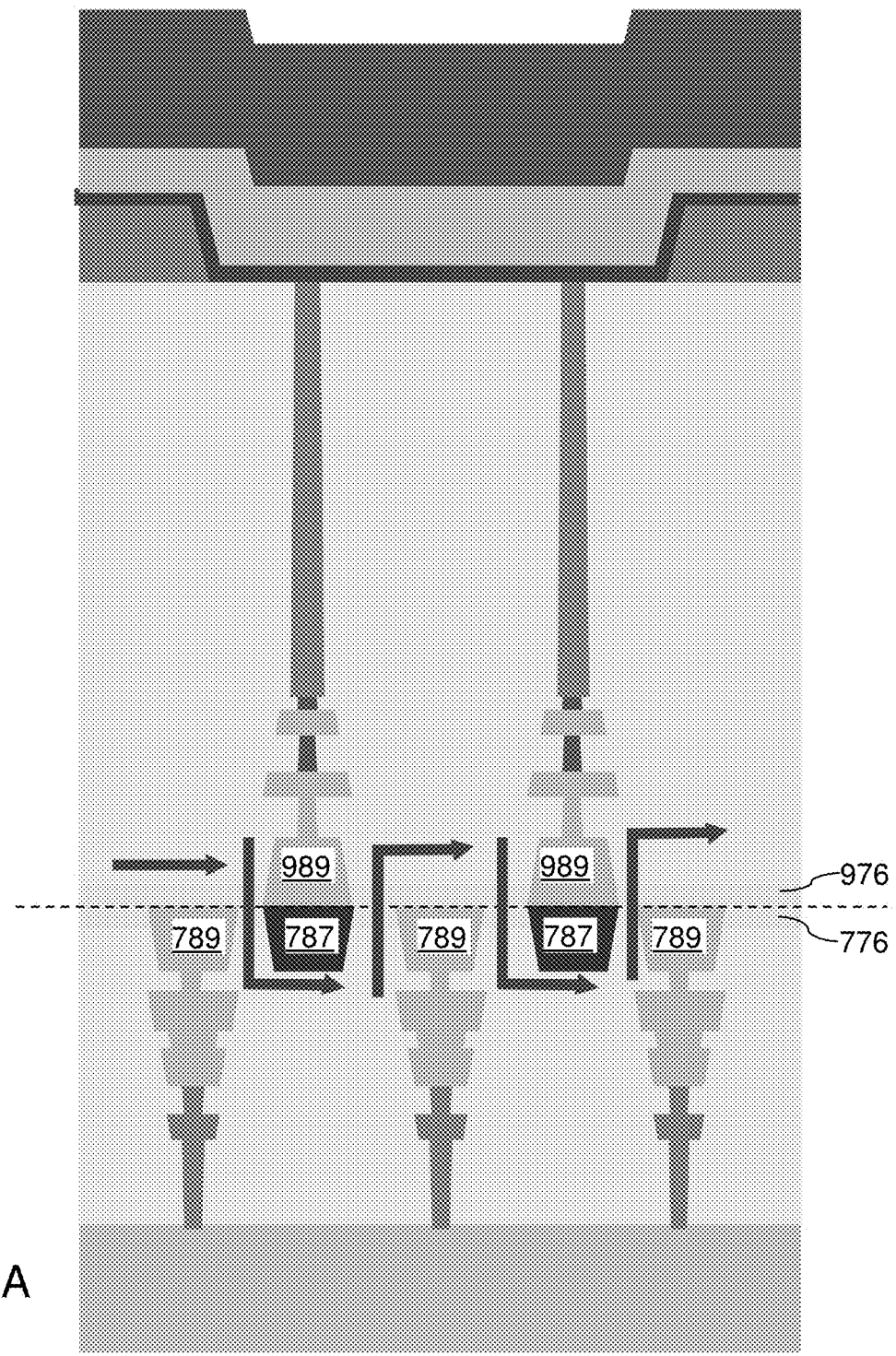
FIGS. 9A-9J are alternative configurations of the peripheral region of the bonded assembly according to various embodiments of the present disclosure.

Referring to FIG. 9A, a first alternative configuration of the exemplary structure can be derived from the exemplary structure of FIG. 8 by employing two of first edge seal structures including a respective first pad-level ring structure 989 and three of second edge seal structures including a respective second pad-level ring structure 789, and by omitting the first dummy metal pads 987. In this case, horizontal surfaces of the second pad-level ring structures 789 can contact the first pad-level diffusion barrier layer 976.

Figure 9B:
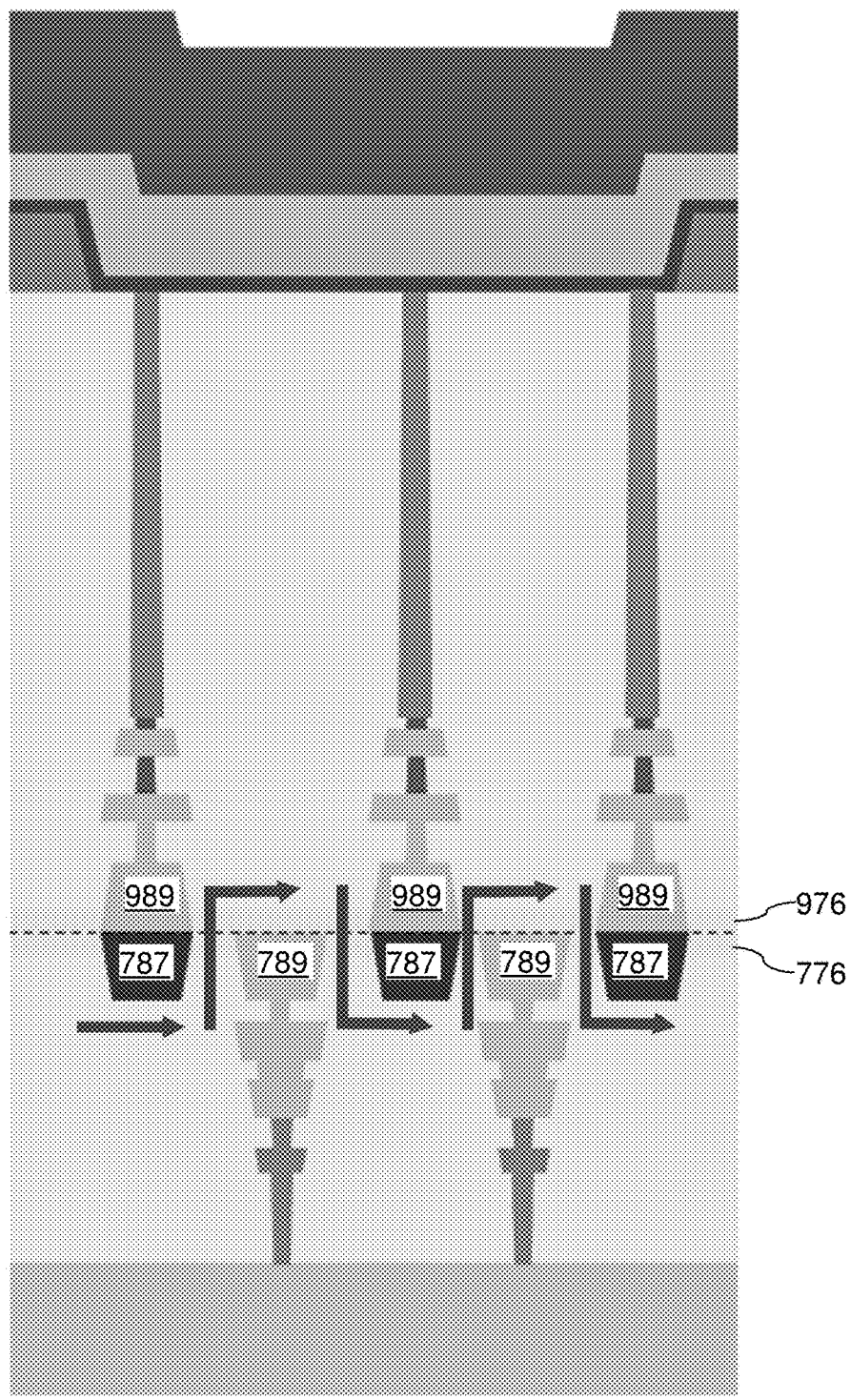

Referring to FIG. 9B, a second alternative configuration of the exemplary structure can be derived from the exemplary structure of FIG. 8 by employing three of first edge seal structures including a respective first pad-level ring structure 989 and two of second edge seal structures including a respective second pad-level ring structure 789, and by omitting the first dummy metal pads 987. In this case, horizontal surfaces of the second pad-level ring structures 789 can contact the first pad-level diffusion barrier layer 976.

Figure 9C:
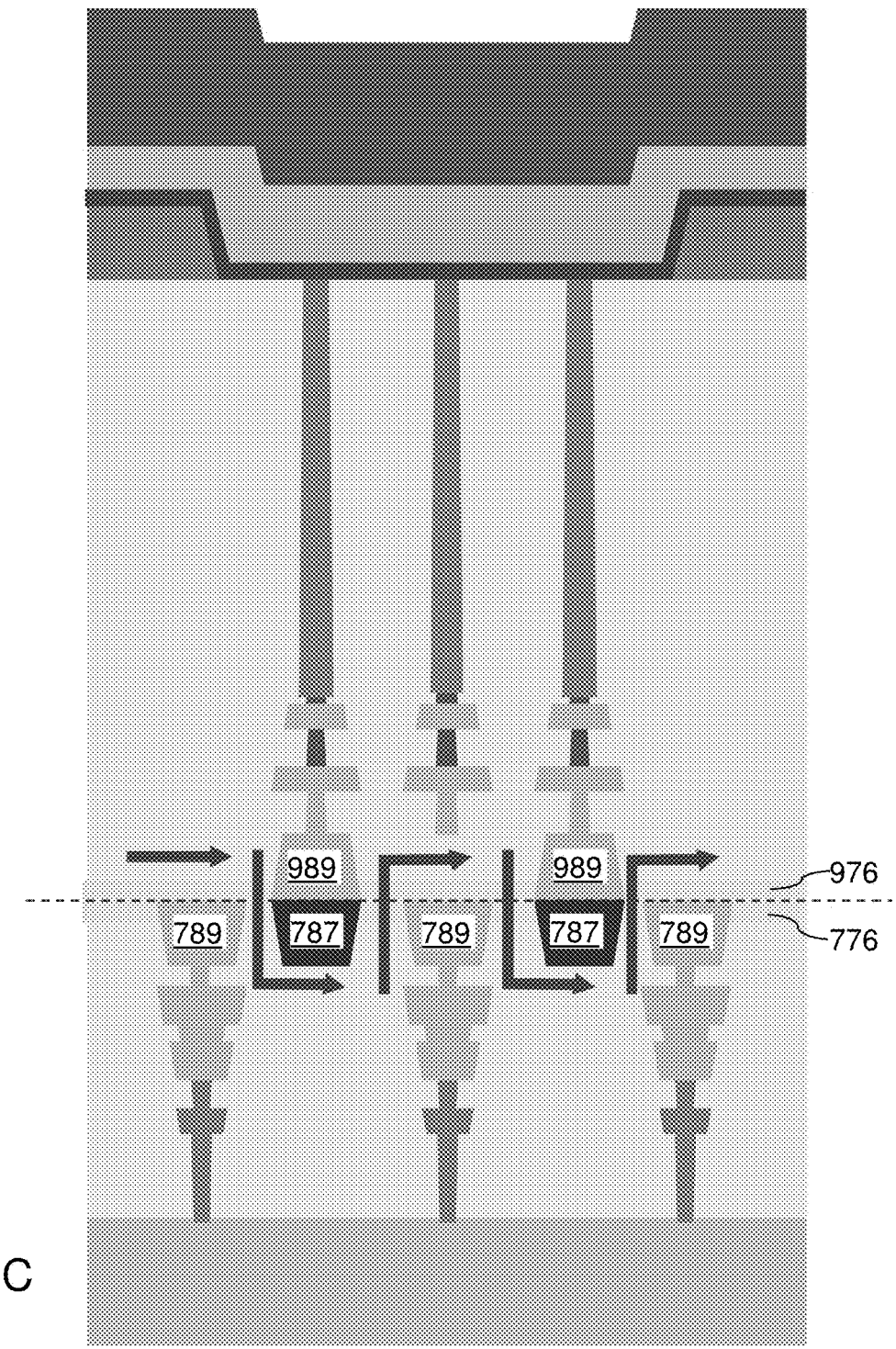

Referring to FIG. 9C, a third alternative configuration of the exemplary structure can be derived from the exemplary structure of FIG. 8 by employing two of first edge seal structures including a respective first pad-level ring structure 989, one first edge seal structure that does not include a first pad-level ring structure, and three of second edge seal structures including a respective second pad-level ring structure 789, and by omitting the first dummy metal pads 987.

Figure 9D:
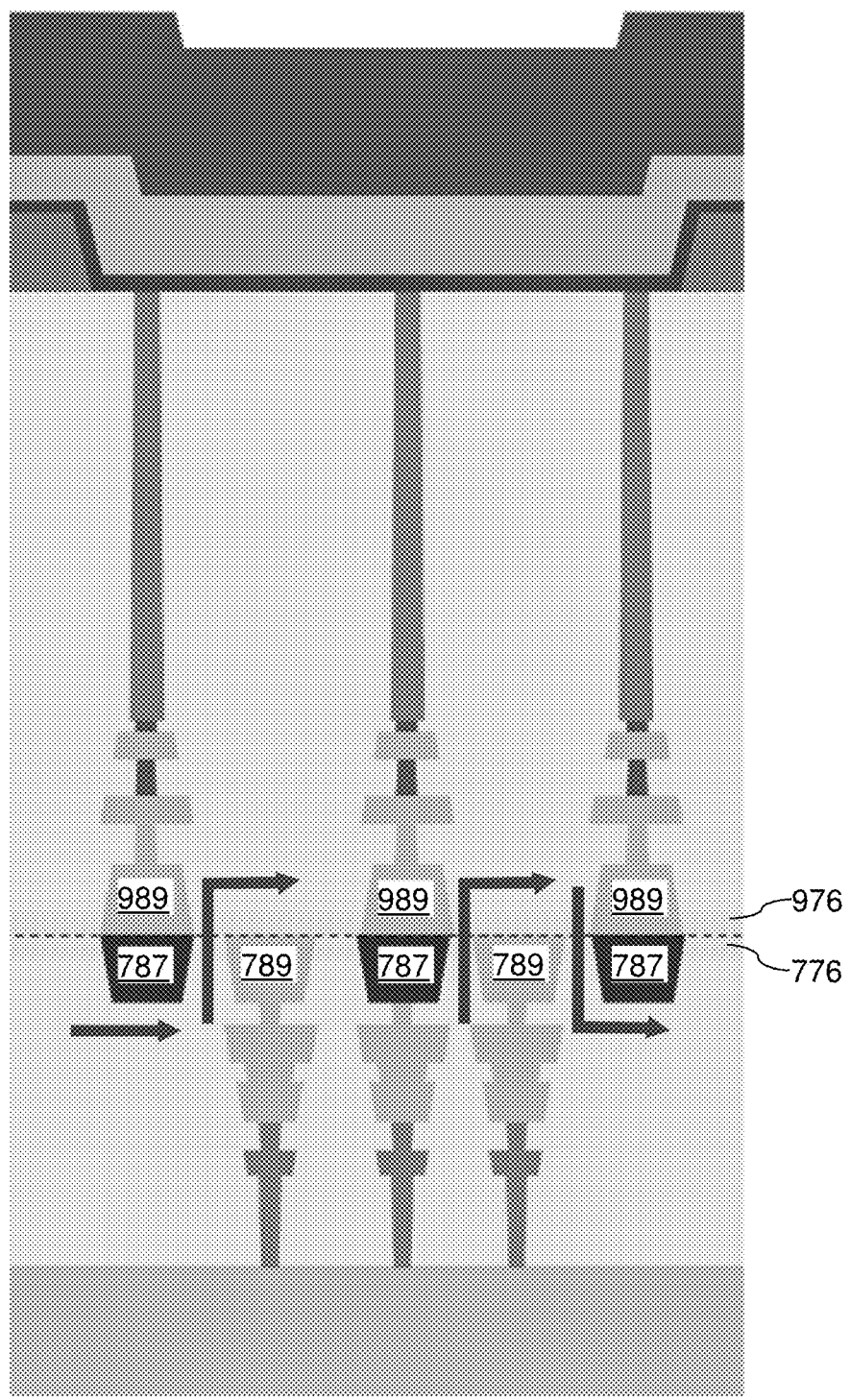

Referring to FIG. 9D, a fourth alternative configuration of the exemplary structure can be derived from the exemplary structure of FIG. 8 by employing three of first edge seal structures including a respective first pad-level ring structure 989, two of second edge seal structures including a respective second pad-level ring structure 789, and a second edge seal structure that does not include a second pad-level ring structure and contacts a row of second dummy metal pads 787, and by omitting the first dummy metal pads 987.

Figure 9E:
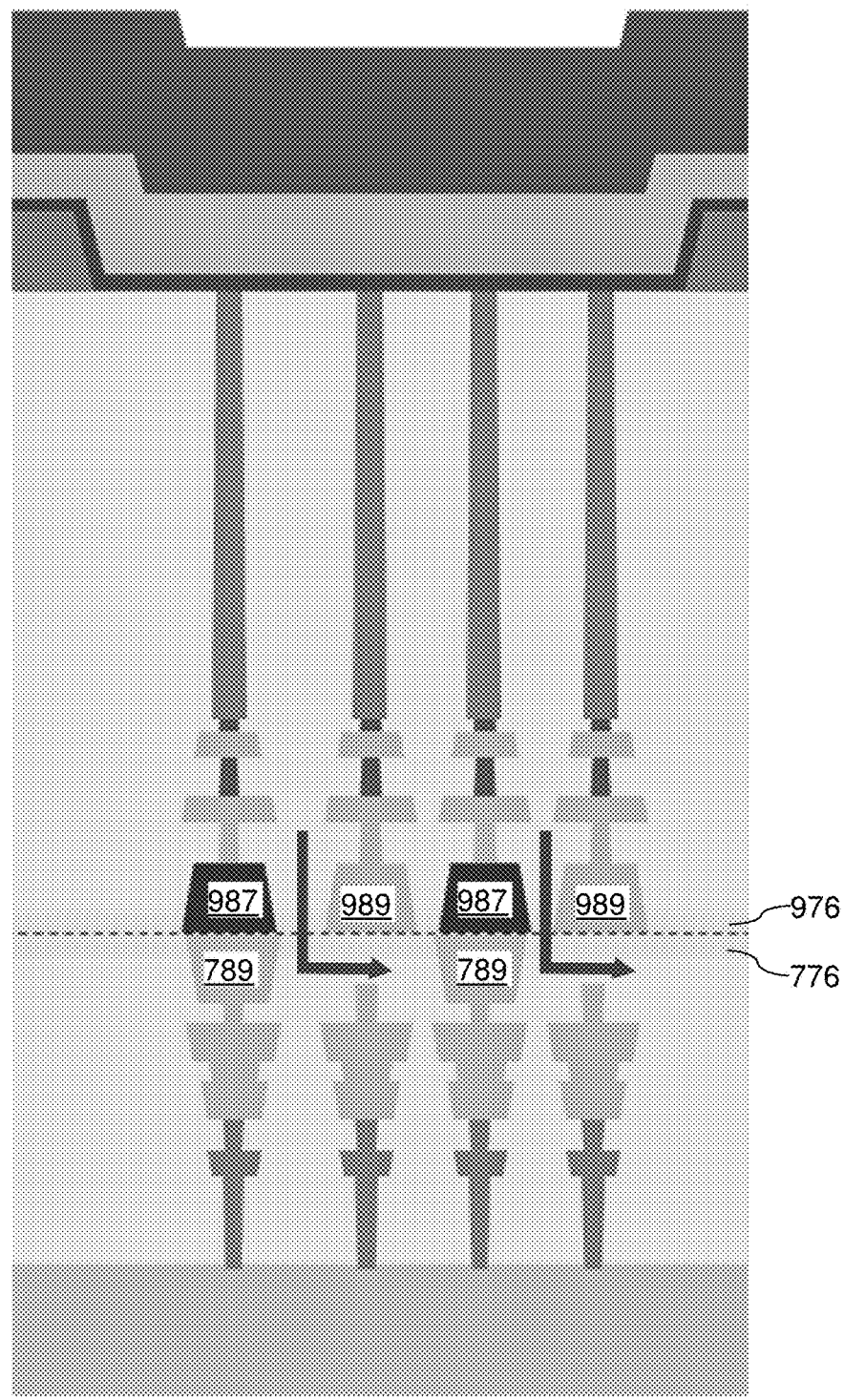

Referring to FIG. 9E, a fifth alternative configuration of the exemplary structure can be derived from the exemplary structure of FIG. 8 by employing two of first edge seal structures including a respective first pad-level ring structure 989, two of first edge seal structures that do not include a first pad-level ring structure and contacting a respective row of first dummy metal pads 987, two of second edge seal structures including a respective second pad-level ring structure 789, and two of second edge seal structure that do not include a second pad-level ring structure, and by omitting the second dummy metal pads 787.

Figure 9F:
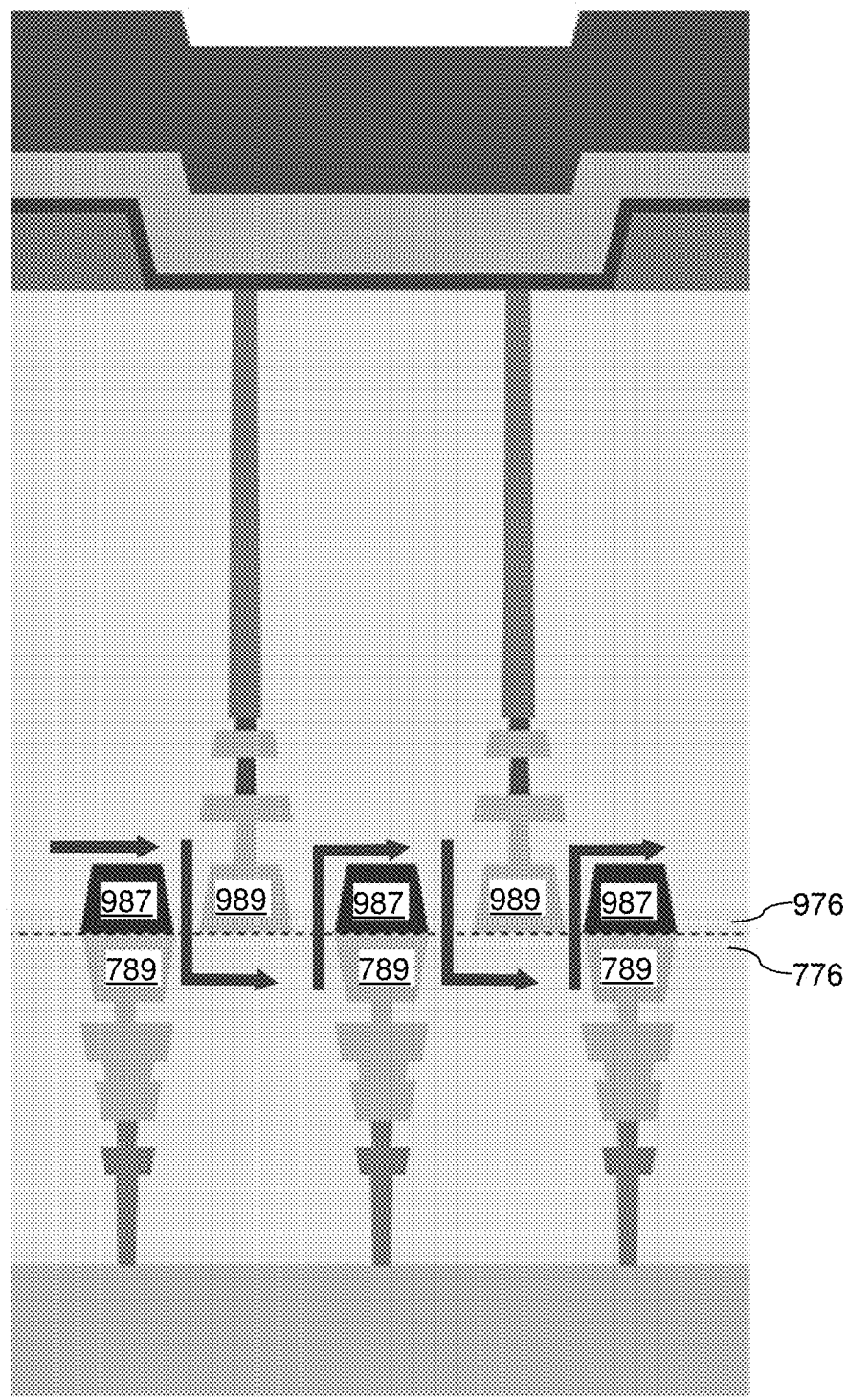

Referring to FIG. 9F, a sixth alternative configuration of the exemplary structure can be derived from the exemplary structure of FIG. 8 by employing two of first edge seal structures including a respective first pad-level ring structure 989 and three of second edge seal structures including a respective second pad-level ring structure 789, and by omitting the second dummy metal pads 787. In this case, horizontal surfaces of the first pad-level ring structures 989 can contact the second pad-level diffusion barrier layer 776.

Figure 9G:
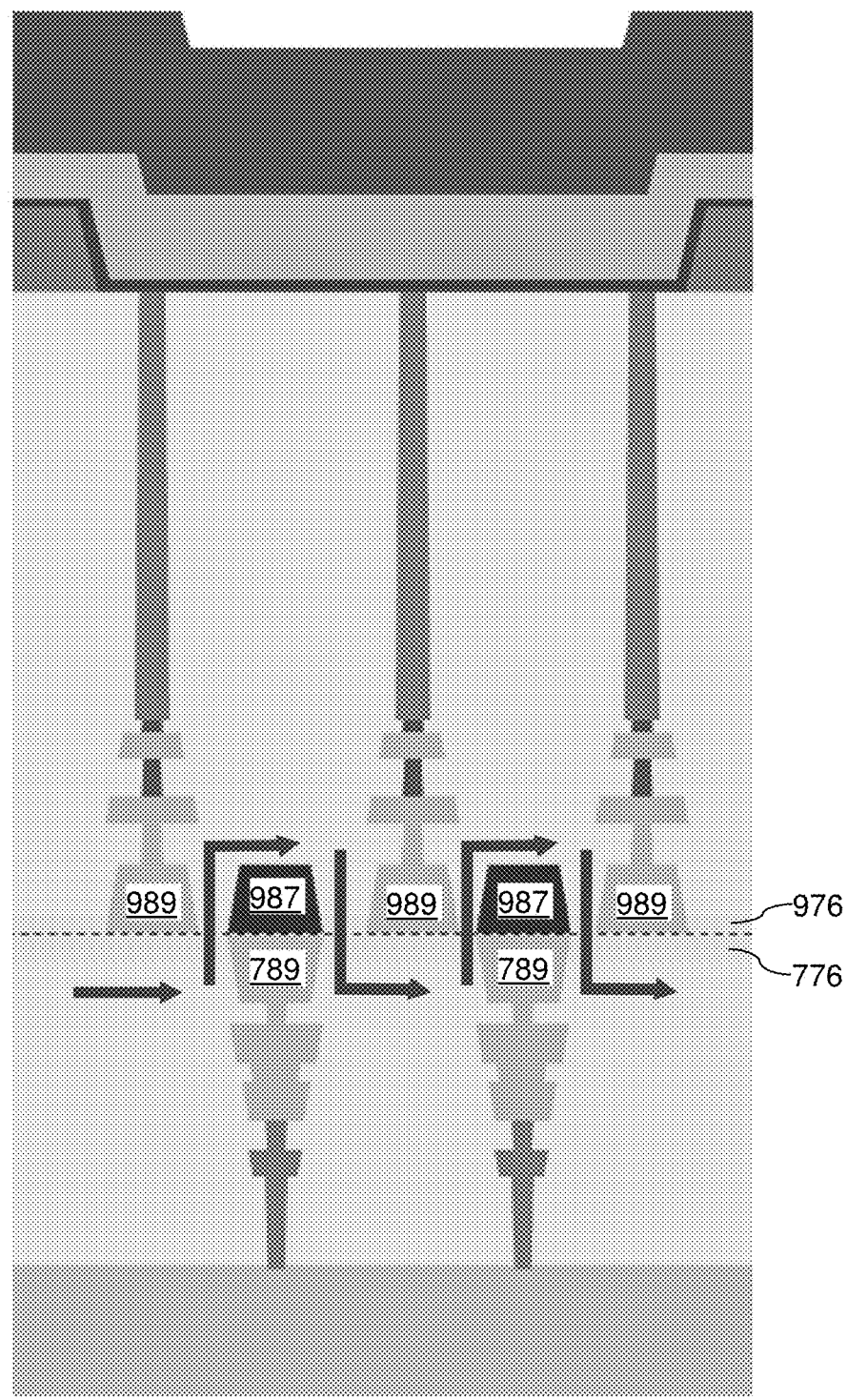

Referring to FIG. 9G, a seventh alternative configuration of the exemplary structure can be derived from the exemplary structure of FIG. 8 by employing three of first edge seal structures including a respective first pad-level ring structure 989 and two of second edge seal structures including a respective second pad-level ring structure 789, and by omitting the second dummy metal pads 787. In this case, horizontal surfaces of the first pad-level ring structures 989 can contact the second pad-level diffusion barrier layer 776.

Figure 9H:
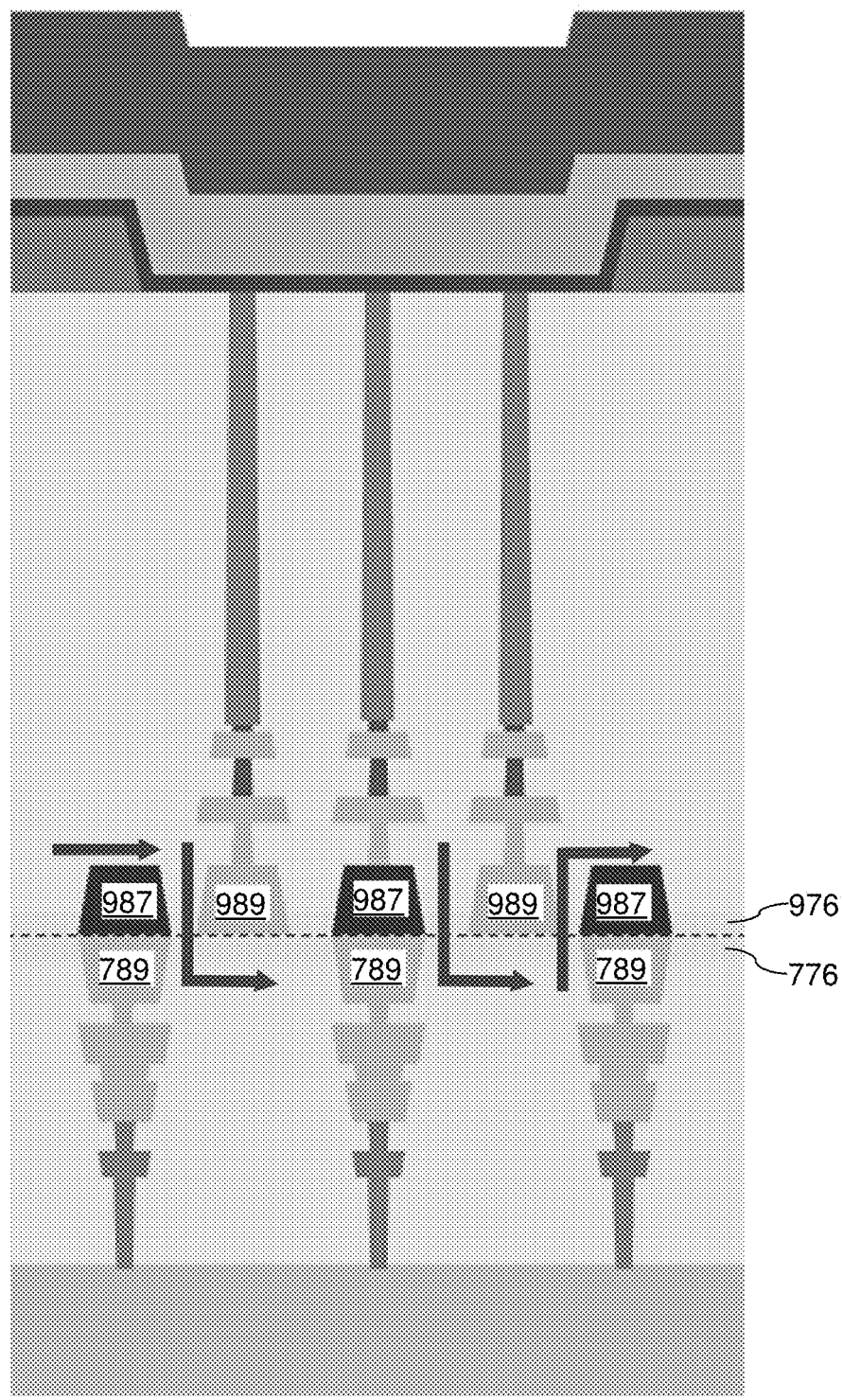

Referring to FIG. 9H, an eighth alternative configuration of the exemplary structure can be derived from the exemplary structure of FIG. 8 by employing two of first edge seal structures including a respective first pad-level ring structure 989, one first edge seal structure that does not include a first pad-level ring structure and contacts a row of first dummy metal pads 987, and three of second edge seal structures including a respective second pad-level ring structure 789, and by omitting the second dummy metal pads 787.

Figure 9I:
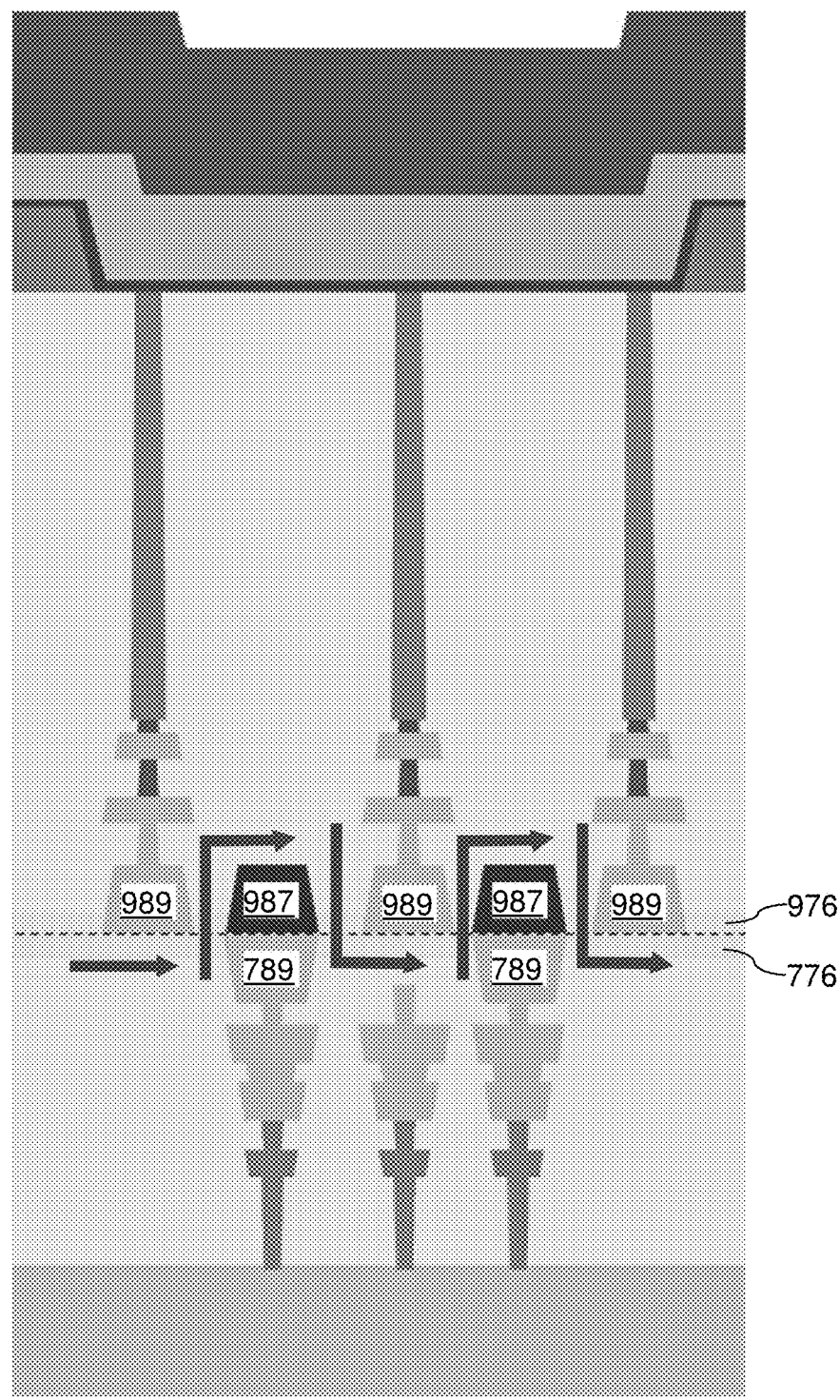

Referring to FIG. 9I, a ninth alternative configuration of the exemplary structure can be derived from the exemplary structure of FIG. 8 by employing three of first edge seal structures including a respective first pad-level ring structure 989, two of second edge seal structures including a respective second pad-level ring structure 789, and a second edge seal structure that does not include a second pad-level ring structure, and by omitting the second dummy metal pads 787.

Figure 9J:
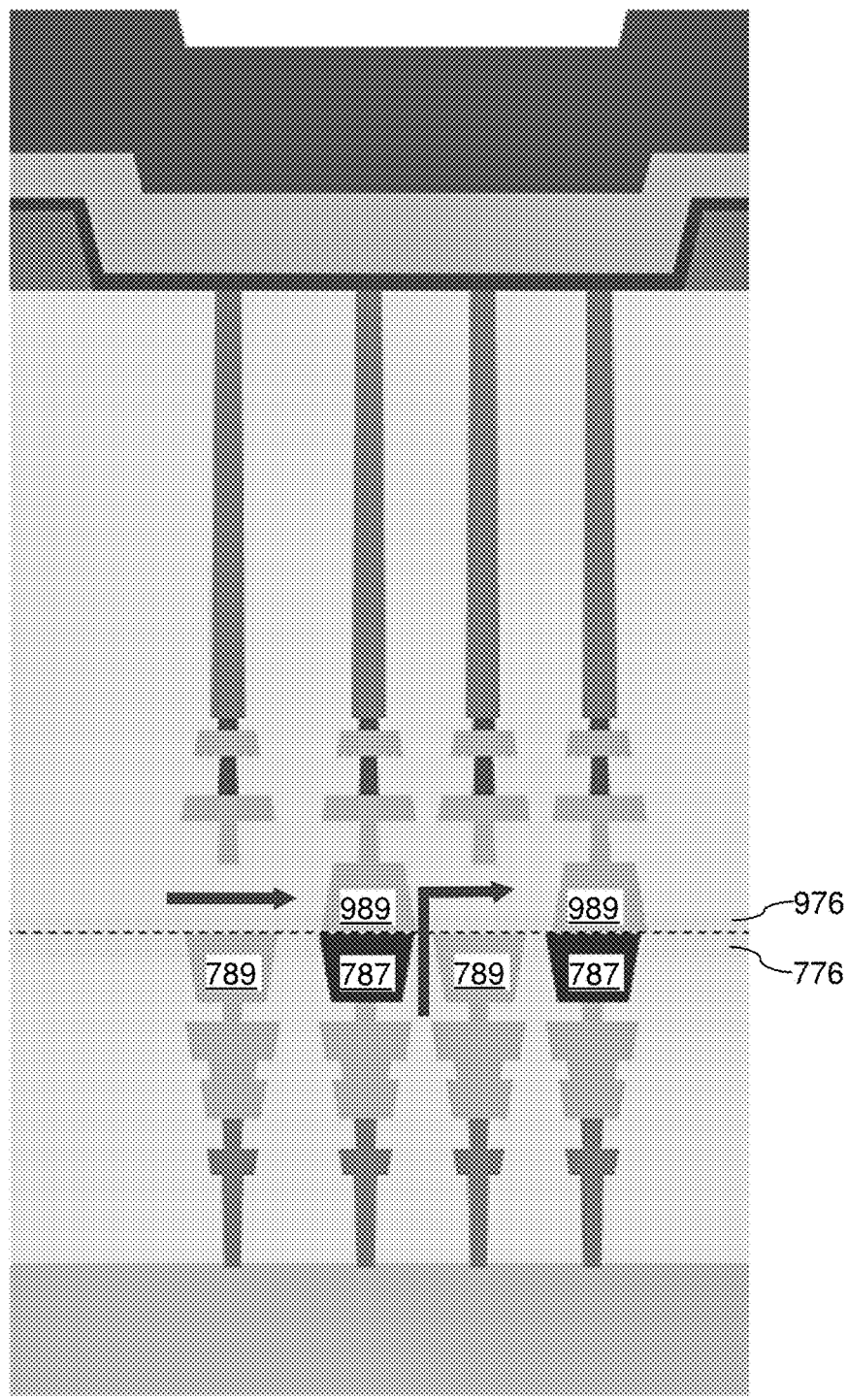

Referring to FIG. 9J, a tenth alternative configuration of the exemplary structure can be derived from the exemplary structure of FIG. 8 by employing two of first edge seal structures including a respective first pad-level ring structure 989, two of first edge seal structures that do not include a first pad-level ring structure, two of second edge seal structures including a respective second pad-level ring structure 789, and two of second edge seal structure that do not include a second pad-level ring structure and contact a respective row of second dummy metal pads 787, and by omitting the first dummy metal pads 987.

Referring to all drawings and according to various embodiments of the present disclosure, a structure comprising a first semiconductor die (which may be the first semiconductor die 900 or the second semiconductor die 700 as described above) is provided. Ordinals merely refer to the order of recitation of similar elements, and are not parts of a proper noun of any element. The first semiconductor die (900 or 700) comprises: first semiconductor devices (920 or 720) located over a first substrate (908 or 708); first interconnect-level dielectric layers {(290, 960) or 760} embedding first metal interconnect structures (980 or 780) and located over the first semiconductor devices (920 or 720); a first pad-level dielectric layer (974 or 774) embedding first bonding pads (988 or 788) and located over the first interconnect-level dielectric layers {(290, 960) or 760}; first edge seal structures {(688, 984, 986, 994, 989) or (588, 784, 786, 794, 789)} laterally surrounding the first semiconductor devices (920 or 720), wherein each of the first edge seal structures {(688, 984, 986, 994, 989) or (588, 784, 786, 794, 789)} vertically extends from the first substrate (908 or 708) to a horizontal plane including bonding surfaces of the first bonding pads (988 or 788), and comprises a respective first pad-level ring structure (989 or 789) that continuously extends around the first semiconductor devices (920 or 720); and at least one row of first dummy metal pads (987 or 787) embedded in the first pad-level dielectric layer (974 or 774).

The first dummy metal pads are not electrically connected to the first edge seal structures or to the first metal interconnect structures.

In one embodiment, each row of first dummy metal pads (987 or 787) is located between a respective pair of first edge seal structures {(688, 984, 986, 994, 989) or (588, 784, 786, 794, 789)}.

Each of the first edge seal structures (688, 984, 986, 994, 989) within a first semiconductor die 900 in a bonded assembly of a first semiconductor die 900 and a second semiconductor die 700 vertically extends from the first substrate 908 to a horizontal plane including a bonding interface between the first bonding pads 988 and the second bonding pads 788. Each of the second edge seal structures (588, 784, 786, 794, 789) within a second semiconductor die 700 in the bonded assembly of the first semiconductor die 900 and the second semiconductor die 700 vertically extends from the second substrate {708 or (730, 732, 740, 750)} to a horizontal plane including the bonding interface between the first bonding pads 988 and the second bonding pads 788.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. A structure comprising a first semiconductor die, wherein the first semiconductor die comprises:
   first semiconductor devices located on a first substrate;
   first interconnect-level dielectric layers embedding first metal interconnect structures and located over the first semiconductor devices;
   a first pad-level dielectric layer embedding first bonding pads and located over the first interconnect-level dielectric layers;
   first edge seal structures laterally surrounding the first semiconductor devices, wherein each of the first edge seal structures vertically extends from the first substrate to a horizontal plane including bonding surfaces of the first bonding pads, and comprises a respective first pad-level ring structure that continuously extends around the first semiconductor devices; and
   at least one row of first dummy metal pads embedded in the first pad-level dielectric layer, wherein the first dummy metal pads are not electrically connected to the first edge seal structures or to the first metal interconnect structures.

2. The structure of claim 1, wherein each row of first dummy metal pads is located between a respective pair of first edge seal structures.

3. The structure of claim 1, wherein:
   the first pad-level ring structures and the first dummy metal pads have a same vertical thickness and have a same material composition; and
   the first bonding pads have a same vertical thickness as the first dummy metal pads.

4. The structure of claim 1, wherein each of the first edge seal structures comprises:
   a respective metallic moat via structure that contacts a respective annular peripheral portion of a top surface of the first substrate; and
   a respective vertical stack of metallic ring structures that vertically extends from an annular top surface of the respective metallic moat via structure to a bottom surface of the respective first pad-level ring structure.

5. The structure of claim 4, wherein each of the metallic ring structures has a same vertical thickness and a same material composition as a respective one of the first metal interconnect structures having a same vertical separation distance from the first substrate.

6. The structure of claim 1, wherein the first edge seal structures are nested among one another without direct contact between them.

7. The structure of claim 1, wherein:
   all sidewalls of the first dummy metal pads contact the first pad-level dielectric layer; and
   all bottom surfaces of the first dummy metal pads contact a respective dielectric surface.

8. The structure of claim 1, wherein each of the first pad-level ring structures comprises a plurality of straight laterally-extending segments that are parallel to a respective one of sidewalls of the first semiconductor die.

9. The structure of claim 1, wherein:
   each of the first bonding pads has a respective rectangular shape having sides with a respective length in a range from 2 microns to 60 microns; and
   each of the first pad-level ring structures has a uniform width in a range from 50% of an average of lengths of sides of the rectangular shapes of the first bonding pads to 200% of the average of lengths of sides of the rectangular shapes of the first bonding pads.

10. The structure of claim 1, wherein the first edge seal structures are electrically grounded to the first substrate.

11. The structure of claim 1, further comprising a second semiconductor die that comprises:
    second semiconductor devices located over a second substrate;
    a second pad-level dielectric layer embedding second bonding pads and located over the second substrate;
    at least one row of second dummy metal pads embedded in the second pad-level dielectric layer, wherein each row of second dummy metal pads is bonded to a respective one of the first edge seal structures through metal-to-metal bonding.

12. The structure of claim 11, wherein the second semiconductor die comprises second edge seal structures laterally surrounding the second semiconductor devices and comprising a respective second pad-level ring structure that continuously extends around the second semiconductor devices, wherein each of the second edge seal structures vertically extends from the second substrate to a horizontal plane including a bonding interface between the first bonding pads and the second bonding pads.

13. The structure of claim 12, wherein each row of first dummy metal pads is bonded to a respective one of the second edge seal structures.

14. The structure of claim 12, wherein each of the second edge seal structures comprises:
- a respective metallic moat via structure that contacts a respective annular peripheral portion of a horizontal surface of the second substrate; and
- a respective vertical stack of metallic ring structures that vertically extends from an annular top surface of the respective metallic moat via structure to a horizontal surface of the respective second pad-level ring structure.

15. A method of forming a structure, the method comprising forming a first semiconductor die by:
- forming first semiconductor devices over a first substrate;
- forming first interconnect-level dielectric layers embedding first metal interconnect structures over the first semiconductor devices; and
- forming a first pad-level dielectric layer embedding first bonding pads, first edge seal structures which comprise first pad-level ring structures, and at least one row of first dummy metal pads over the first interconnect-level dielectric layers, wherein:
- the first edge seal structures laterally surround the first semiconductor devices;
- each of the first edge seal structures vertically extends from the first substrate to a horizontal plane including bonding surfaces of the first bonding pads; and
- a row of first dummy metal pads is formed between a pair of first edge seal structures.

16. The method of claim 15, wherein the first pad-level ring structures, the first dummy metal pads, and the first bonding pads are formed by forming cavities in the first pad-level dielectric layer, simultaneously depositing at least one metallic material in each of the cavities, and removing excess portions of the at least one material from above the horizontal plane including the distal surface of the first pad-level dielectric layer.

17. The method of claim 15, further comprising
- forming metallic moat via structures that contact a respective annular peripheral portion of a top surface of the first substrate and laterally surrounding the first semiconductor devices; and
- forming vertical stacks of metallic ring structures that vertically extend from an annular top surface of the respective one of the metallic moat via structures to a topmost surface of the first interconnect-level dielectric material layers,
wherein each of the first edge seal structures comprises a respective one of the metallic moat via structures and a respective vertical stack among the vertical stacks of metallic ring structures.

18. The method of claim 15, further comprising:
- forming a second semiconductor die by forming second semiconductor devices over a second substrate, forming a second pad-level dielectric layer over the second semiconductor devices, and forming second bonding pads and at least one row of second dummy metal pads in the second pad-level dielectric layer; and
- bonding the second semiconductor die to the first semiconductor die such that each row of second dummy metal pads is bonded to a respective one of the first edge seal structures through metal-to-metal bonding.

19. The method of claim 18, wherein:
- the method further comprises forming second edge seal structures in the second semiconductor die;
- each of the second edge seal structures comprises a respective second pad-level ring structure that continuously extends around the second semiconductor devices; and
- each of the second edge seal structures vertically extends from the second substrate to a horizontal plane including a bonding interface between the first metal pads and the second metal pads.

20. The method of claim 19, wherein each row of first dummy metal pads is bonded to a respective one of the second edge seal structures.

* * * * *